US012765183B2

(12) United States Patent
Shin et al.

(10) Patent No.: US 12,765,183 B2

(45) Date of Patent: Oct. 13, 2026

(54) DISPLAY PANEL AND MANUFACTURING METHOD FOR THE SAME

(71) Applicant: Samsung Display Co., Ltd., Yongin-si (KR)

(72) Inventors: Hyuneok Shin, Yongin-si (KR); Joonyong Park, Yongin-si (KR); Sukyoung Yang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 310 days.

(21) Appl. No.: 18/583,606

(22) Filed: Feb. 21, 2024

(65) Prior Publication Data

US 2024/0349541 A1 Oct. 17, 2024

(30) Foreign Application Priority Data

Apr. 13, 2023 (KR) ........................ 10-2023-0048502

(51) Int. Cl.

*H10K 59/122* (2023.01)
*H10K 59/12* (2023.01)
*H10K 59/80* (2023.01)

(52) U.S. Cl.

CPC ....... *H10K 59/122* (2023.02); *H10K 59/1201* (2023.02); *H10K 59/80522* (2023.02); *H10K 59/8731* (2023.02)

(58) Field of Classification Search

CPC ............. H10K 59/122; H10K 59/1201; H10K 59/80522; H10K 59/8731; H10K 59/12; H10K 50/814; H10K 50/824; H10K 50/84; H10K 59/80516; H10K 59/87; H10K 71/00; H10K 59/873; H10K 71/16; H10K 71/60

See application file for complete search history.

(56) References Cited

U.S. PATENT DOCUMENTS

| | | | | |
|---|---|---|---|---|
| 10,720,598 B2 | 7/2020 | Jeong et al. | | |
| 11,348,983 B1 | 5/2022 | Choung et al. | | |
| 11,626,574 B2 | 4/2023 | Kim et al. | | |
| 2024/0164148 A1* | 5/2024 | Shin | ..................... | H10K 59/122 |
| 2024/0172483 A1* | 5/2024 | Park | ..................... | H10K 59/122 |
| 2024/0237424 A1* | 7/2024 | Jung | ..................... | H10K 59/122 |
| 2024/0268157 A1* | 8/2024 | Shin | ..................... | H10K 59/122 |
| 2024/0276787 A1* | 8/2024 | Bae | .................... | H10K 59/1201 |
| 2024/0306433 A1* | 9/2024 | Shin | ..................... | H10K 59/122 |

(Continued)

FOREIGN PATENT DOCUMENTS

| | | |
|---|---|---|
| KR | 10-2020-0121427 A | 10/2020 |
| KR | 10-2421575 B1 | 7/2022 |

*Primary Examiner* — Earl N Taylor

(74) *Attorney, Agent, or Firm* — Womble Bond Dickinson (US) LLP

(57) ABSTRACT

A display panel includes: a base layer; a pixel defining layer on the base layer and having an emission opening; a partition wall including: a first partition wall layer on the pixel defining layer; and a second partition wall layer on the first partition wall layer and having a partition wall opening corresponding to the emission opening; a light-emitting element in the partition wall opening and including an anode, an intermediate layer, and a cathode contacting the partition wall; and an auxiliary electrode on the light-emitting element and extending along a first inner surface of the first partition wall layer and a lower surface of the second partition wall layer.

20 Claims, 24 Drawing Sheets

(56) References Cited

U.S. PATENT DOCUMENTS

| | | | | |
|---|---|---|---|---|
| 2024/0357870 | A1* | 10/2024 | Park | H10K 59/1201 |
| 2024/0365598 | A1* | 10/2024 | Shin | H10K 59/1201 |
| 2025/0024713 | A1* | 1/2025 | Shin | H10K 50/155 |
| 2025/0072226 | A1* | 2/2025 | Park | H10K 59/873 |
| 2025/0098430 | A1* | 3/2025 | Chang | H10K 59/122 |
| 2025/0098457 | A1* | 3/2025 | Shin | H10K 59/88 |
| 2025/0107347 | A1* | 3/2025 | Park | H10K 59/80521 |
| 2025/0107401 | A1* | 3/2025 | Lee | H10K 59/873 |
| 2025/0120263 | A1* | 4/2025 | Yang | H10K 59/1201 |
| 2025/0176363 | A1* | 5/2025 | Yang | H10K 59/1201 |
| 2025/0176402 | A1* | 5/2025 | Shin | H10K 59/80521 |
| 2025/0176410 | A1* | 5/2025 | Yang | H10K 59/122 |
| 2025/0185468 | A1* | 6/2025 | Shin | H10K 59/1201 |
| 2025/0185469 | A1* | 6/2025 | Shin | H10K 59/80521 |
| 2025/0234718 | A1* | 7/2025 | Choi | H10K 59/873 |

* cited by examiner

DISPLAY PANEL AND MANUFACTURING METHOD FOR THE SAME

CROSS-REFERENCE TO RELATED APPLICATIONS

The present application claims priority to and the benefit of Korean Patent Application No. 10-2023-0048502, filed on Apr. 13, 2023, the entire content of which is incorporated herein incorporated by reference.

BACKGROUND

Aspects of some embodiments of the present disclosure herein relate to a display panel and a method for manufacturing the same.

Display devices that display images to users, such as televisions, monitors, smartphones, and tablet PCs, include a display panel for displaying images. Various display panels such liquid crystal display panels, organic light-emitting display panels, electro wetting display panels, and electrophoretic display panels, are developed.

Organic light-emitting display panels may include an anode, a cathode, and a light-emitting pattern. The light-emitting pattern may be separated in each light-emitting region, and the cathode may provide a common voltage for each light-emitting region.

The above information disclosed in this Background section is only for enhancement of understanding of the background and therefore the information discussed in this Background section does not necessarily constitute prior art.

SUMMARY

Aspects of some embodiments of the present disclosure herein relate to a display panel and a method for manufacturing the same, and for example, to a display panel with relatively improved display quality.

With regard to a display panel in which a light-emitting element is formed without using a metal mask, aspects of some embodiments of the present disclosure include a display panel with relatively improved display quality and a method for manufacturing the same.

According to some embodiments of the present disclosure, a display panel includes: a base layer, a pixel defining layer, which is arranged on the base layer and in which an emission opening is defined, a partition wall, which includes a first partition wall layer arranged on the pixel defining layer and a second partition wall layer arranged on the first partition wall layer and in which a partition wall opening corresponding to the emission opening is defined, a light-emitting element arranged in the partition wall opening and including an anode, an intermediate layer, and a cathode contacting the partition wall, and an auxiliary electrode arranged on the light-emitting element and extending along a first inner surface of the first partition wall layer and a lower surface of the second partition wall layer.

According to some embodiments, the auxiliary electrode may extend along the first inner surface of the first partition wall layer, the lower surface of the second partition wall layer, and a second inner surface of the second partition wall layer.

According to some embodiments, the partition wall may include a first portion that the cathode contacts and a second portion that the auxiliary electrode contacts, wherein an area size of the second portion may be larger than an area size of the first portion.

According to some embodiments, the auxiliary electrode may cover the cathode.

According to some embodiments, the display panel may further include a lower encapsulation inorganic pattern arranged on the auxiliary electrode, wherein the lower encapsulation inorganic pattern may directly contact the auxiliary electrode.

According to some embodiments, the display panel may further include a capping pattern arranged on the cathode.

According to some embodiments, the cathode, the capping pattern, and the auxiliary electrode may be sequentially arranged in a thickness direction of the base layer.

According to some embodiments, the cathode, the auxiliary electrode, and the capping pattern may be sequentially arranged in a thickness direction of the base layer.

According to some embodiments, the auxiliary electrode may include an indium tin oxide (ITO) or indium zinc oxide (IZO).

According to some embodiments of the present disclosure, a display panel includes: a base layer; a pixel defining layer, which is arranged on the base layer and in which an emission opening is defined; a partition wall, which includes a first partition wall layer arranged on the pixel defining layer and a second partition wall layer arranged on the first partition wall layer and in which a partition wall opening corresponding to the emission opening is defined; a light-emitting element arranged in the partition wall opening and including an anode, an intermediate layer, and a cathode contacting the partition wall; an auxiliary electrode arranged on the light-emitting element; and a lower encapsulation inorganic pattern arranged on the auxiliary electrode, wherein the lower encapsulation inorganic pattern directly contacts the auxiliary electrode.

According to some embodiments, the auxiliary electrode may extend along a first inner surface of the first partition wall layer and a lower surface of the second partition wall layer.

According to some embodiments, the auxiliary electrode may cover the cathode.

According to some embodiments, the display panel may further include a capping pattern arranged on the cathode, wherein the cathode, the capping pattern, and the auxiliary electrode may be sequentially arranged in a thickness direction of the base layer.

According to some embodiments, the display panel may further include a capping pattern arranged on the cathode, wherein the cathode, the auxiliary electrode, and the capping pattern may be sequentially arranged in a thickness direction of the base layer.

According to some embodiments, the auxiliary electrode may include an indium tin oxide (ITO) or indium zinc oxide (IZO).

According to some embodiments, the partition wall may include a first portion that the cathode contacts and a second portion that the auxiliary electrode contacts, wherein an area size of the second portion may be larger than an area size of the first portion.

According to some embodiments of the present disclosure, a method for manufacturing a display panel includes: providing a preliminary display panel including a base layer, a pixel defining layer arranged on the base layer, a first preliminary partition wall layer arranged on the pixel defining layer, and a second preliminary partition wall layer arranged on the first preliminary partition wall layer; forming a first partition wall layer and a second partition wall layer in which a partition wall opening is formed by etching the first preliminary partition wall layer and the second preliminary partition wall layer; forming a light-emitting pattern and a cathode contacting the first partition wall layer in the partition wall opening; and forming, on the cathode, an auxiliary electrode extending along a first inner surface of the first partition wall layer and a lower surface of the second partition wall layer.

According to some embodiments, the forming of the light-emitting pattern and the cathode may include a thermal evaporation process, and the forming of the auxiliary electrode may include a sputtering process.

According to some embodiments, the method may further include forming a lower encapsulation inorganic pattern on the auxiliary electrode, wherein the lower encapsulation inorganic pattern may directly contact the auxiliary electrode.

According to some embodiments, the method may further include forming a capping pattern on the cathode.

BRIEF DESCRIPTION OF THE FIGURES

The accompanying drawings are included to provide a further understanding of aspects of some embodiments according to the present disclosure, and are incorporated in and constitute a part of this specification. The drawings illustrate embodiments of the present disclosure and, together with the description, serve to explain principles of embodiments according to the present disclosure. In the drawings.

DETAILED DESCRIPTION

Figure 1A:
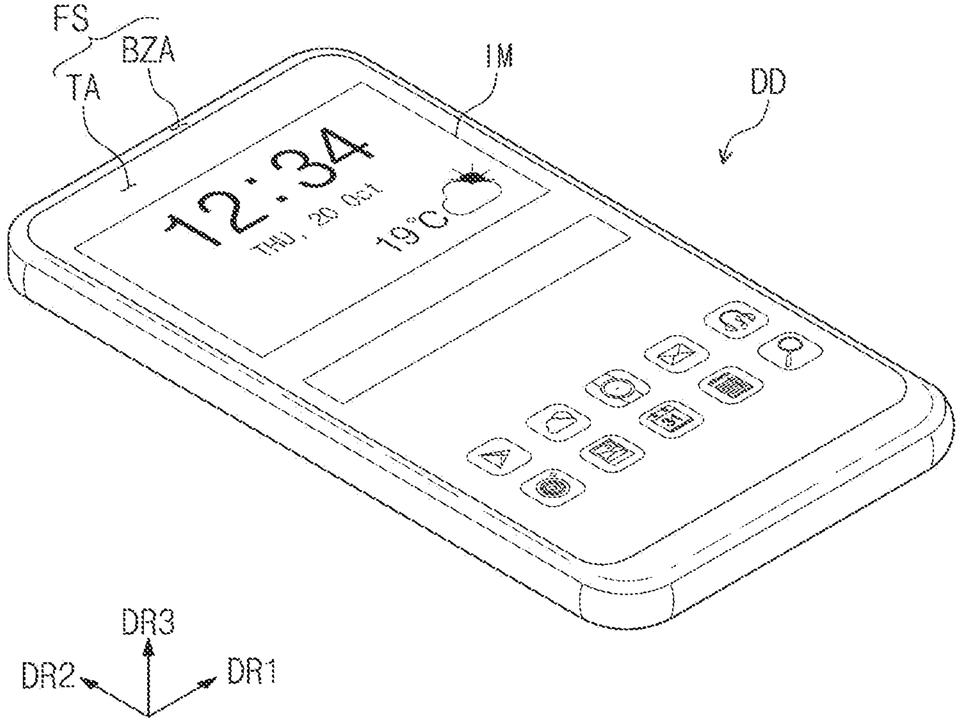
FIG. 1A is a perspective view of a display device according to some embodiments of the present disclosure.

It will be understood that when an element (or a region, layer, portion, or the like) is referred to as being "on", "connected to", or "coupled to" another element, it can be directly on or directly connected/coupled to the other element, or a third element may be present therebetween.

The same reference numerals refer to the same elements. In the drawings, the thicknesses, ratios, and dimensions of elements are exaggerated for clarity of illustration. As used herein, the term "and/or" includes any combinations that can be defined by associated elements.

The terms "first", "second" and the like may be used for describing various elements, but the elements should not be construed as being limited by the terms. Such terms are only used for distinguishing one element from other elements. For example, a first element could be termed a second element and vice versa without departing from the scope of the right of the present invention. The terms of a singular form may include plural forms unless otherwise specified.

Furthermore, the terms "under", "lower side", "on", "upper side", and like are used to describe association relationships among elements illustrated in the drawings. The terms, which are relative concepts, are used on the basis of directions illustrated in the drawings.

It will be further understood that the terms "include", "including", "has", "having", and the like, when used in this specification, specify the presence of stated features, numbers, steps, operations, elements, components, or combinations thereof, but do not preclude the presence or addition of one or more other features, numbers, steps, operations, elements, components, or combinations thereof.

All of the terms used herein (including technical and scientific terms) have the same meanings as understood by those skilled in the art, unless otherwise defined. Terms in common usage such as those defined in commonly used dictionaries should be interpreted to contextually match the lexical meanings in the relevant art, and should not be interpreted in an idealized or overly formal sense unless otherwise defined explicitly.

Hereinafter, aspects of some embodiments of the present disclosure will be described in more detail with reference to the accompanying drawings.

Figure 1B:
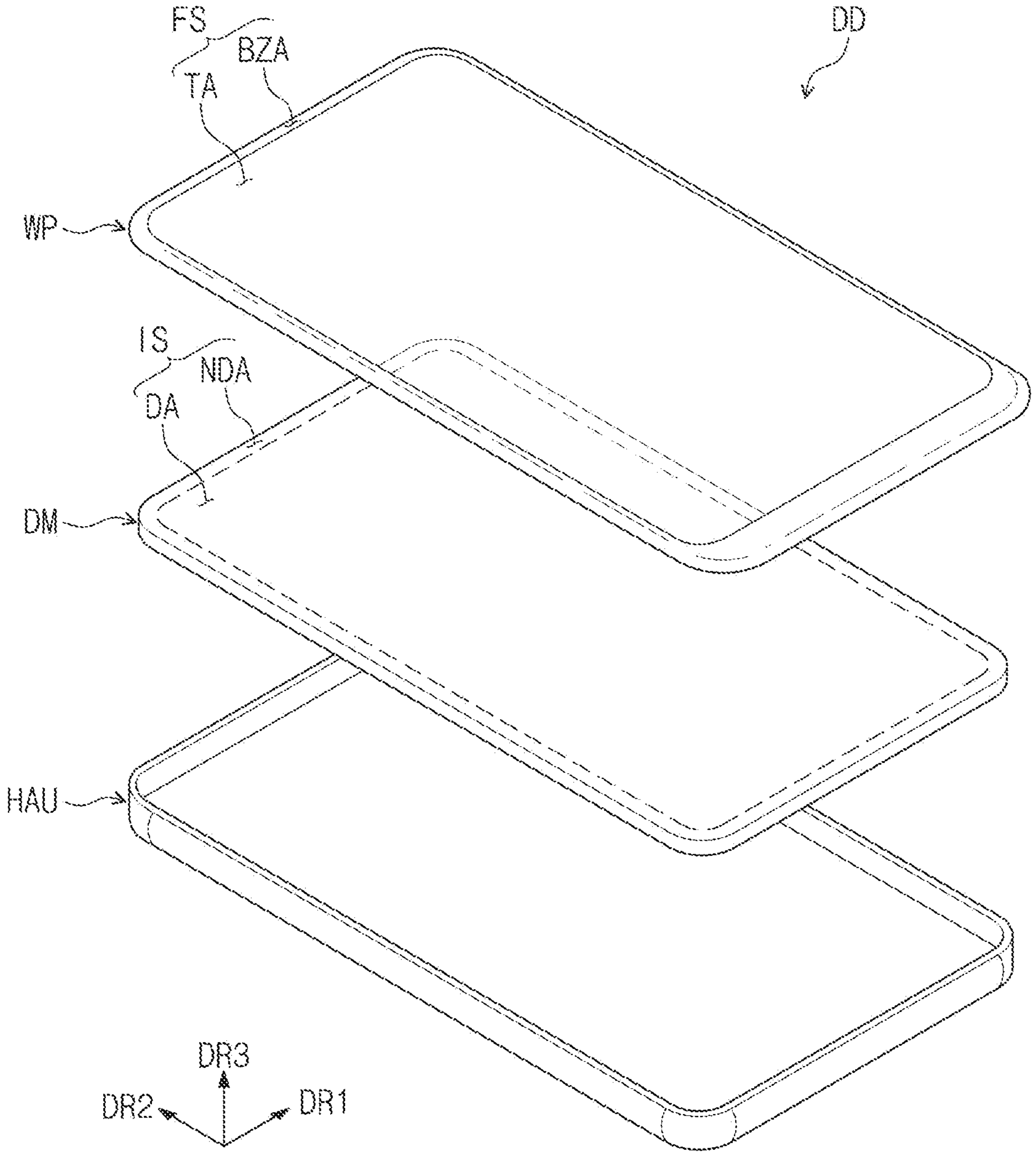
FIG. 1B is an exploded perspective view of a display device according to some embodiments of the present disclosure.

FIG. 1A is a perspective view of a display device DD according to some embodiments of the present disclosure, and FIG. 1B is an exploded perspective view of the display device DD according to some embodiments of the present disclosure.

According to some embodiments, the display device DD may be a large-size electronic device such as a television, a monitor, or an outdoor advertising board. Furthermore, the display device DD may be a small- or medium-size electronic device such as a personal computer, a laptop computer, a personal digital assistant, a vehicle navigation unit, a game machine, a smartphone, a tablet PC, and a camera. However, this is merely an example, and the display device DD may also be adopted as other display devices without departing from the spirit and scope of embodiments according to the present disclosure. In FIGS. 1A and 1B, the display device DD is illustrated as an example as a smartphone, but embodiments are not limited thereto.

Referring to FIGS. 1A and 1B, the electronic device DD may display, in a third direction DR3, an image IM on a display surface FS parallel to each of a first direction DR1 and a second direction DR2. The image IM may include not only a dynamic image but also a still or static image. A clock window and icons are illustrated as an example of the image IM in FIG. 1A. The display surface FS, on which the image IM is displayed, may correspond to a front surface of the display device DD.

According to some embodiments, front surfaces (or upper surfaces) and rear surfaces (or lower surfaces) of members are defined based on the direction in which the image IM is displayed. The front surfaces and the rear surfaces may face each other in the third direction DR3, and a normal direction of each of the front surfaces and the rear surfaces may be parallel with the third direction DR3. The directions indicated by the first to third directions DR1 to DR3 are relative concept and thus may be changed to other directions. Herein, the term "in a plan view" may be defined as being viewed in the third direction DR3.

The display device DD may include a window WP, a display module DM, and a housing HAU. The window WP and the housing HAU may be coupled to each other to form an exterior of the display device DD.

The window WP may include an optically clear or transparent (or translucent) insulating material. For example, the window WP may include glass or plastic. The front surface of the window WP may define the display surface FS of the display device DD. The display surface FS may include a transmissive region TA and a bezel region BZA. The transmissive region TA may be an optically clear region. For example, the transmissive region TA may be a region having at least about 90% transmittance of visual light.

The bezel region BZA may have a relatively low light transmittance compared to the transmissive region TA. The bezel region BZA may define a shape of the transmissive region TA. The bezel region BZA may be adjacent to and surround the transmissive region TA. However, this is merely illustrative, and according to some embodiments, the bezel region BZA of the window WP may not be provided. The window WP may include at least one functional layer among an anti-fingerprint layer, a hard coating layer, and an anti-reflective layer, but is not limited to a certain embodiment.

The display module DM may be arranged under the window WP. The display module DM may substantially generate the image IM. The image IM generated by the display module DM is displayed on the display surface IS of the display module DM and externally viewed by a user through the transmissive region TA.

The display module DM may include a display region DA and a non-display region NDA. The display region DA may be a region which is activated in response to an electric signal. The non-display region NDA may be adjacent to the display region DA. The non-display region NDA may surround the display region DA. The non-display region NDA may be a region covered with the bezel region BZA and may not be externally viewed.

The housing HAU may be coupled to the window WP. The housing HAU may provide an internal space (e.g., a set or predetermined internal space) by being coupled to the window WP. The display module DM may be accommodated in the internal space.

The housing HAU may include a material having a relatively high rigidity. For example, the housing HAU may include glass, plastic, or metal, or may include a plurality of frames and/or plates configured with a combination thereof. The housing HAU may stably protect components of the display device DD accommodated in the internal space from an external impact.

Figure 2:
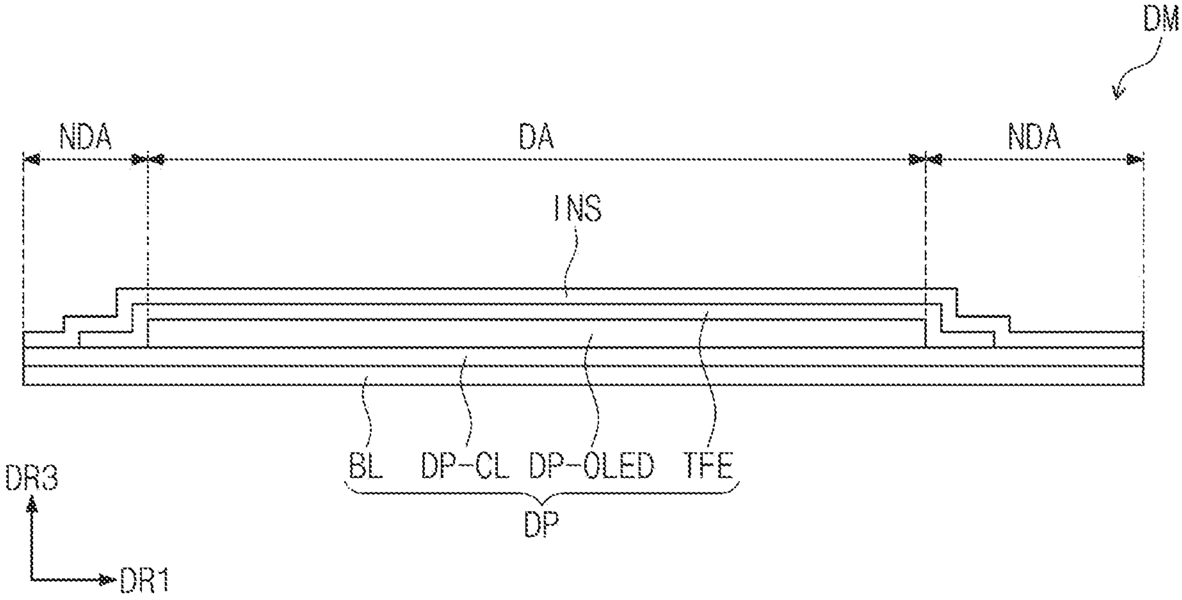
FIG. 2 is a cross-sectional view illustrating a display module according to some embodiments of the present disclosure.

FIG. 2 is a cross-sectional view illustrating the display module DM according to some embodiments of the present disclosure.

Referring to FIG. 2, the display module DM may include a display panel DP and an input sensor INS. According to some embodiments, the display device DD (see FIG. 1A) may further include a protective member arranged on a lower surface of the display panel DP or an anti-reflective member and/or window member arranged on an upper surface of the input sensor INS.

The display panel DP may be an emissive display panel. However, this is merely an example, and embodiments of the present disclosure are not particularly limited thereto. For example, the display panel DP may be an organic light-emitting display panel or an inorganic light-emitting display panel. An emission layer in the organic light-emitting display panel may include an organic light-emitting material. An emission layer in the inorganic light-emitting display panel may include a quantum dot, quantum rod, or micro LED. Hereinafter, the display panel DP will be described as an organic light-emitting display panel.

The display panel DP may include a base layer BL, a circuit element layer DP-CL arranged on the base layer BL, a display element layer DP-OLED, and a thin-film encapsulation layer TFE. The input sensor INS may be directly arranged on the thin-film encapsulation layer TFE. In the present disclosure, the wording "component A is directly arranged on component B" represents that an adhesive member is not arranged between component A and component B.

The base layer BL may include at least one plastic film. The base layer BL may include, as a flexible substrate, a plastic substrate, a glass substrate, a metal substrate, an organic/inorganic composite material substrate, etc. The display region DA and the non-display region NDA described with reference to FIG. 1B may be similarly defined in the base layer BL.

The circuit element layer DP-CL may include at least one insulating layer and circuit element. The insulating layer includes at least one inorganic layer and at least one organic layer. The circuit element includes signal lines, a pixel driving circuit, etc.

The display element layer DP-OLED may include a partition wall and a light-emitting element. The light-emitting element may include an anode, an intermediate layer, and a cathode.

The thin-film encapsulation layer TFE may include a plurality of thin films. A portion of the thin films may be arranged to improve optical efficiency, and another portion of the thin films may be arranged to protect organic light-emitting diodes.

The input sensor INS obtains coordinate information about an external input. The input sensor INS may have a multi-layer structure. The input sensor INS may include a conductive single- or multi-layer. Furthermore, the input sensor INS may include an insulating single- or multi-layer. The input sensor INS may sense an external input in a capacitive manner. However, this is merely an example, and embodiments of the present disclosure are not limited thereto. For example, according to some embodiments, the input sensor INS may sense an external input in an electromagnetic induction manner or pressure sensing manner. Meanwhile, according to some embodiments of the present disclosure, the input sensor INS may not be provided.

Figure 3:
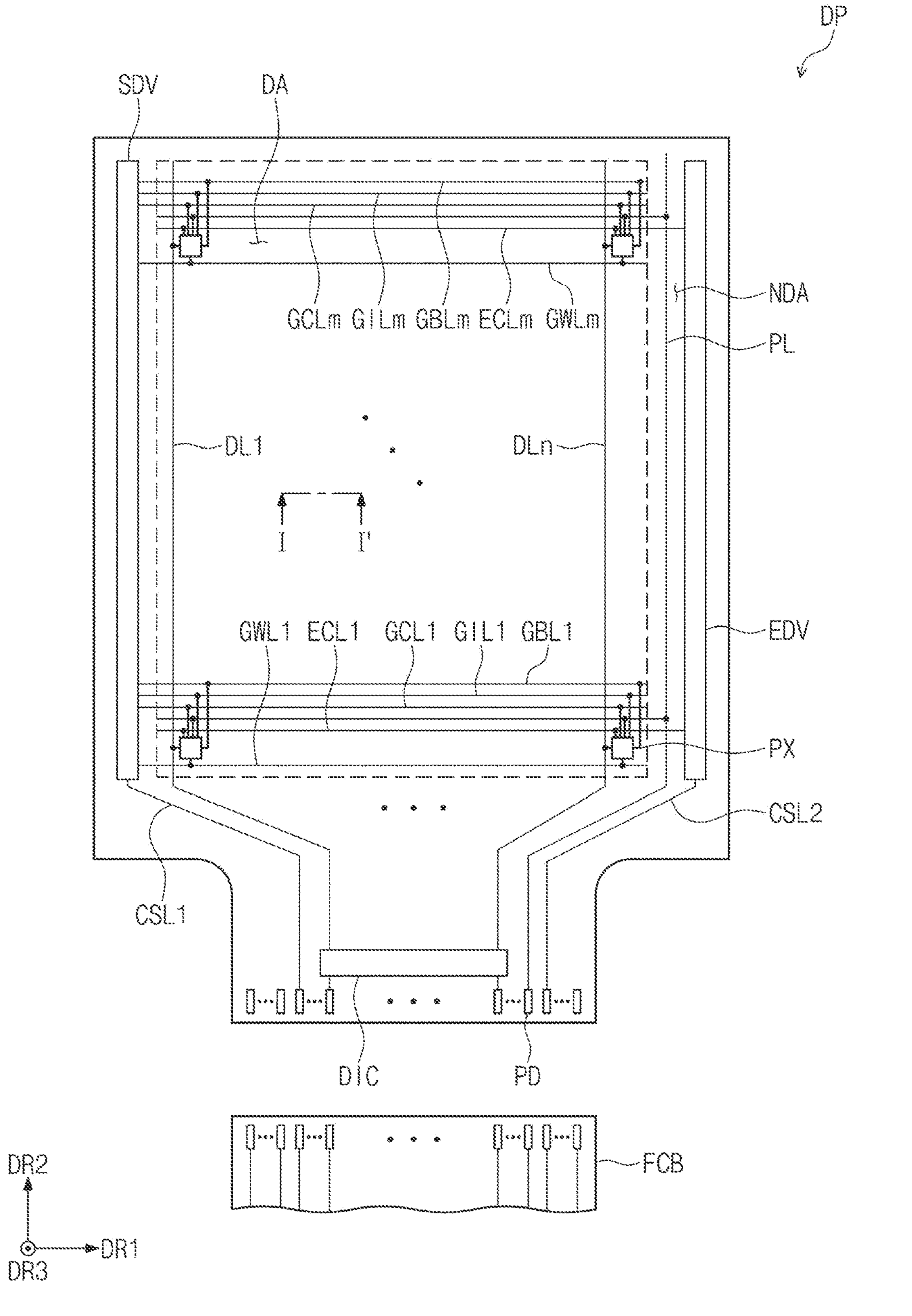
FIG. 3 is a plan view of a display panel according to some embodiments of the present disclosure.

FIG. 3 is a plan view illustrating the display panel DP according to some embodiments of the present disclosure.

Referring to FIG. 3, the display region DA and the non-display region NDA around the display region DA may be defined in the display panel DP. The display region DA and the non-display region NDA may be divided according to whether pixels PX are present. The pixels PX may be arranged in the display region DA but may not be arranged in the non-display region NDA.

The display panel DP may include pixels PX, initialization scan lines GIL1 to GILm, compensation scan lines GCL1 to GCLm, write scan lines GWL1 to GWLm, black scan lines GBL1 to GBLm, emission control lines ECL1 to ECLm, data lines DL1 to DLn, first and second control lines CSL1 and CSL2, a driving voltage line PL, a scan driving unit SDV, a data driving unit, an emission driving unit EDV, a driving chip DIC, 1 and pads PD. Here, m and n are natural numbers equal to or larger than 2. The data driving unit may be a partial circuit configured in a driving chip DIC.

The pixels PX may be connected to the initialization scan lines GIL1 to GILm, the compensation scan lines GCL1 to GCLm, the write scan lines GWL1 to GWLm, the black scan lines GBL1 to GBLm, the emission control lines ECL1 to ECLm, and the data lines DL1 to DLn.

The initialization scan lines GIL1 to GILm, the compensation scan lines GCL1 to GCLm, the write scan lines GWL1 to GWLm, and the black scan lines GBL1 to GBLm may extend in the first direction DR1 and may be electrically connected to the scan driving unit SDV. The data lines DL1 to DLn may extend in the second direction DR2 and may be electrically connected to the driving chip DIC. The emission control lines ECL1 to ECLm may extend in the first direction DR1 and may be electrically connected to the emission driving unit EDV.

The driving voltage line PL may include a portion extending in the first direction DR1 and a portion extending in the second direction DR2. The portion extending in the first direction DR1 and the portion extending in the second direction DR2 may be arranged on different layers. The driving voltage line PL may provide a driving voltage to the pixels PX.

The first control line CSL1 may be connected to the scan driving unit SDV. The second control line CSL2 may be connected to the emission driving unit EDV.

The driving chip DIC, the driving voltage line PL, the first control line CSL1, and the second control line CSL2 may be electrically connected to the pads PD. A flexible circuit film FCB may be electrically connected to the pads PD through an anisotropic conductive adhesive layer. The pads PD may be utilized for connecting the flexible circuit film FCB to the display panel DP. The pads PD may be connected to corresponding pixels PX through the driving voltage line PL, the first control line CSL1, and the second control line CSL2.

The pads PD may further include input pads. The input pads may be utilized for connecting the flexible circuit film FCB to the input sensor INS (see FIG. 2). However, embodiments according to the present disclosure are not limited thereto, and the input pads may be arranged in the input sensor INS and connected to a circuit board separate from the pads PD. Alternatively, the input sensor INS may not be provided, and the input pads may not be further included.

Figure 4:
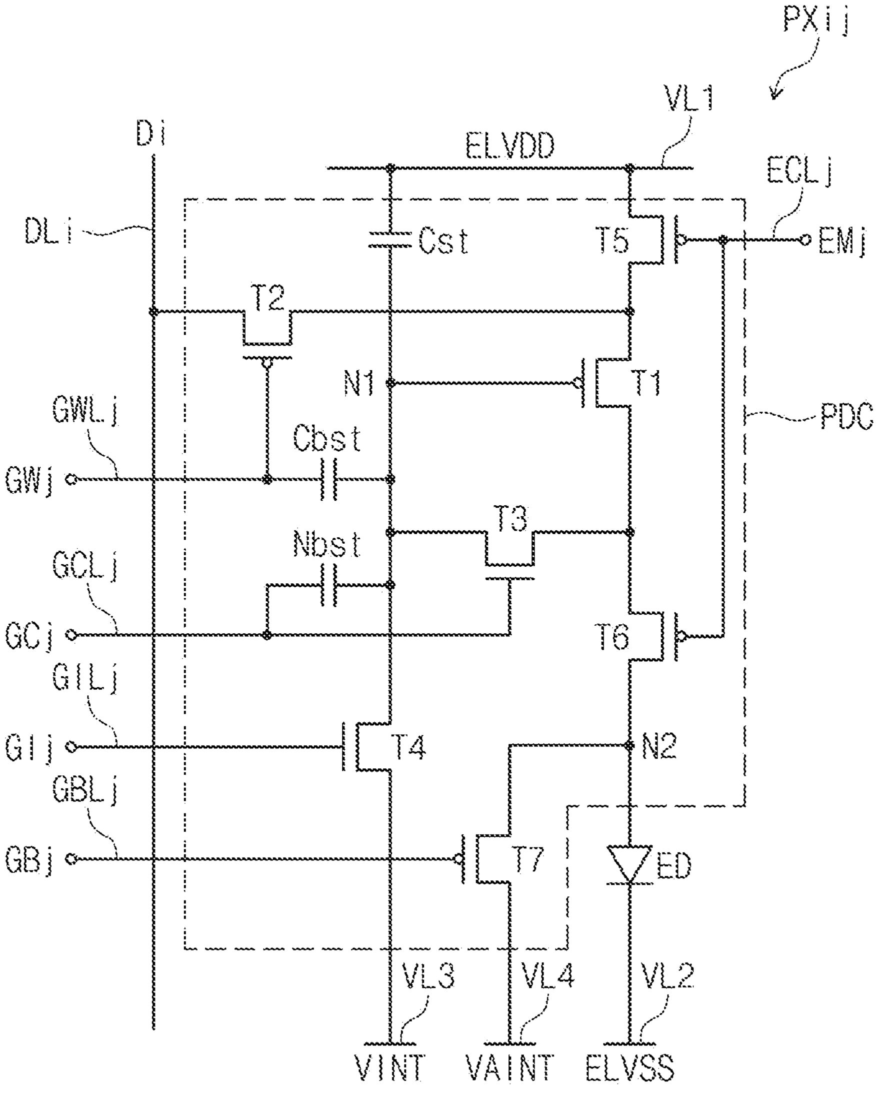
FIG. 4 is an equivalent circuit diagram of a pixel according to some embodiments of the present disclosure.

FIG. 4 is an equivalent circuit diagram of a pixel PXij according to some embodiments of the present disclosure.

FIG. 4 illustrates an example equivalent circuit diagram of one pixel PXij among the plurality of pixels PX (see FIG. 3). Because each of the plurality of pixels PX has the same circuit structure, descriptions of the pixel PXij are also applied to the other pixels PX.

Referring to FIGS. 3 and 4, the PXij is connected to an i-th data line DLi among the data lines DL1 to DLn, a j-th initialization scan line GILj among the initialization scan lines GIL1 to GILm, a j-th compensation scan line GCLj among the compensation scan lines GCL1 to GCLm, a j-th write scan line GWLj among the write scan lines GWL1 to GWLm, a j-th black scan line GBLj among the black scan lines GBL1 to GBLm, a j-th emission control line ECLj among the emission control lines ECL1 to ECLm, first and second driving voltage lines VL1 and VL2, and first and second initialization voltage lines VL3 and VL4. Here, i is an integer of 1 to n, and j is an integer of 1 to m.

The pixel PXij includes a light-emitting element ED and a pixel circuit PDC. The light-emitting element ED may be a light-emitting diode. For example, the light-emitting element ED may be an organic light-emitting diode including an organic emission layer, but embodiments according to the present disclosure are not particularly limited thereto. The pixel circuit PDC may control an amount of current flowing through the light-emitting element ED in response to a data signal Di. The light-emitting element ED may emit light at a luminance (e.g., a set or predetermined luminance) according to the amount of current provided from the pixel circuit PDC.

The pixel circuit PDC may include first to seventh transistors T1, T2, T3, T4, T5, T6, and T7 and first to third capacitors Cst, Cbst, and Nbst. The configuration of the pixel circuit PDC according to some embodiments of the present disclosure is not limited to the embodiments illustrated in FIG. 4. The pixel circuit PDC illustrated in FIG. 4 is merely an example, and the configuration of the pixel circuit PDC may be modified.

For example, at least one of the first to seventh transistors T1 to T7 may be a transistor having a low-temperature polycrystalline silicon (LTPS) semiconductor layer. At least one of the first to seventh transistors T1 to T7 may be a transistor having an oxide semiconductor layer. For example, the third and fourth transistors T3 and T4 may be oxide semiconductor transistors, and the first, second, and fifth to seventh transistors T1, T2, and T5 to T7 may be LTPS transistors.

For example, the first transistor T1, which directly affects brightness of the light-emitting element ED, may include a semiconductor layer including polycrystalline silicon having high reliability so that a high-definition display device may be implemented. Meanwhile, an oxide semiconductor has high carrier mobility and low leakage current, and thus a voltage drop is not significant even if a driving time is long. That is, low-frequency driving may be possible because a color change in an image due to a voltage drop is not significant during the low-frequency driving. Because an oxide semiconductor has an advantage of low current leakage as described above, an oxide semiconductor may be adopted as at least one of the third transistor T3 or the fourth transistor T4 connected to a gate electrode of the first transistor T1 so that leakage current that may flow to the gate electrode may be prevented or reduced and power consumption may be relatively reduced.

Some of the first to seventh transistors T1 to T7 may be P-type transistors, and the others may be N-type transistors. For example, the first, second, and fifth to seventh transistors T1, T2, and T5 to T7 may be P-type transistors, and the third and fourth transistors T3 and T4 may be N-type transistors.

The configuration of the pixel circuit PDC according to some embodiments of the present disclosure is not limited to the embodiments illustrated with respect to FIG. 4. The pixel circuit PDC illustrated in FIG. 4 is merely an example, and the configuration of the pixel circuit PDC may be modified. For example, all of the first to seventh transistors T1 to T7 may be P-type transistors or N-type transistors. Alternatively, the first, second, fifth, and sixth transistors T1, T2, T5, and T6 may be P-type transistors, and the third, fourth, and seventh transistors T3, T4, and T7 may be N-type transistors. Additionally, according to some embodiments, the pixel circuit PDC may include additional components or fewer components and/or the structure of the pixel circuit PDC may vary from what is illustrated in FIG. 4, without departing from the spirit and scope of embodiments according to the present disclosure.

The j-th initialization scan line GILj, the j-th compensation scan line GCLj, the j-th write scan line GWLj, the j-th black scan line GBLj, and the j-th emission control line ECLj may respectively deliver a j-th initialization scan signal GIj, a j-th compensation scan signal GCj, a j-th write scan signal GWj, a j-th black scan signal GBj, and a j-th emission control signal EMj to the pixel PXij. The i-th data line DLi transfers the i-th data signal Di to the pixel PXij. The i-th data signal Di may have a voltage level corresponding to an image signal input to the display device DD (see FIG. 1).

The first and second driving voltage lines VL1 and VL2 may respectively transfer a first driving voltage ELVDD and a second driving voltage ELVSS to the pixel PXij. Furthermore, the first and second initialization voltage lines VL3 and VL4 may respectively transfer a first initialization voltage VINT and a second initialization voltage VAINT to the pixel PXij.

The first transistor T1 is connected between the light-emitting element ED and the first driving voltage line VL1 receiving the first driving voltage ELVDD. The first transistor T1 includes a first electrode connected to the first driving voltage line VL1 via the fifth transistor T5, a second electrode connected to a pixel electrode (or anode) of the light-emitting element ED via the sixth transistor T6, and a third electrode (e.g., gate electrode) connected to one end (e.g., first node N1) of the first capacitor Cst. The first transistor T1 may receive the i-th data signal Di transferred through the i-th data line DLi according to a switching operation of the second transistor T2 to supply a driving current to the light-emitting element ED.

The second transistor T2 is connected between the data line DLi and the first electrode of the first transistor T1. The second transistor T2 includes a first electrode connected to the data line DLi, a second electrode connected to the first electrode of the first transistor T1, and a third electrode (e.g., gate electrode) connected to the j-th write scan line GWLj. The second transistor T2 may be turned on in response to the write scan signal GWj received through the j-th write scan line GWLj to transfer, to the first electrode of the first transistor T1, the i-th data signal Di received through the i-th data line DLi. One end of the second capacitor Cbst may be connected to the third electrode of the second transistor T2, and the other end of the second capacitor Cbst may be connected to the first node N1.

The third transistor T3 is connected between the second electrode of the first transistor T1 and the first node N1. The third transistor T3 includes a first electrode connected to the third electrode of the first transistor T1, a second electrode connected to the second electrode of the first transistor T1, and a third electrode (e.g., gate electrode) connected to the j-th compensation scan line GCLj. The third transistor T3 may be turned on in response to the j-th compensation scan signal GCj received through the j-th compensation scan line GCLj to connect the third electrode of the first transistor T1 and the second electrode of the first transistor T1 to each other so as to diode-connect the first transistor T1. One end of the third capacitor Nbst may be connected to the third electrode of the third transistor T3, and the other end of the third capacitor Nbst may be connected to the first node N1.

The fourth transistor T4 is connected between the first node N1 and the first initialization voltage line VL3 to which the first initialization voltage VINT is applied. The fourth transistor T4 includes a first electrode connected to the first initialization voltage line VL3 through which the first initialization voltage VINT is transferred, a second electrode connected to the first node N1, and a third electrode (e.g., gate electrode) connected to the j-th initialization scan line GILj. The fourth transistor T4 is turned on in response to the j-th initialization scan signal GIj received through the j-th initialization scan line GILj. The turned-on fourth transistor T4 may transfer the first initialization voltage VINT to the first node N1 so as to initialize potential of the third electrode of the first transistor T1 (i.e., potential of the first node N1).

The fifth transistor T5 includes a first electrode connected to the first driving voltage line VL1, a second electrode connected to the first electrode of the first transistor T1, and a third electrode (e.g., gate electrode) connected to the j-th emission control line ECLj. The sixth transistor T6 includes a first electrode connected to the second electrode of the first transistor T1, a second electrode connected to the pixel electrode of the light-emitting element ED, and a third electrode (e.g., gate electrode) connected to the j-th emission control line ECLj.

The fifth and sixth transistors T5 and T6 are simultaneously turned on in response to the j-th emission control signal EMj received through the j-th emission control line ECLj. The first driving voltage ELVDD applied through the turned-on fifth transistor T5 may be transferred to the light-emitting element ED via the sixth transistor T6 after being compensated through the diode-connected first transistor T1.

The seventh transistor T7 includes a first electrode connected to the second initialization voltage line VL4 through which the second initialization voltage VAINT is transferred, a second electrode connected to the second electrode of the sixth transistor T6, and a third electrode (e.g., gate electrode) connected to the j-th black scan line GBLj. The second initialization voltage VAINT may have a voltage level that is equal to or lower than the first initialization voltage VINT.

One end of the first capacitor Cst is connected to the third electrode of the first transistor T1, and the other end of the first capacitor Cst is connected to the first driving voltage line VL1. A cathode of the light-emitting element ED may be connected to the second driving voltage line VL2 for transferring the second driving voltage ELVSS. The second driving voltage ELVSS may have a lower voltage level than the first voltage ELVDD.

Figure 5:
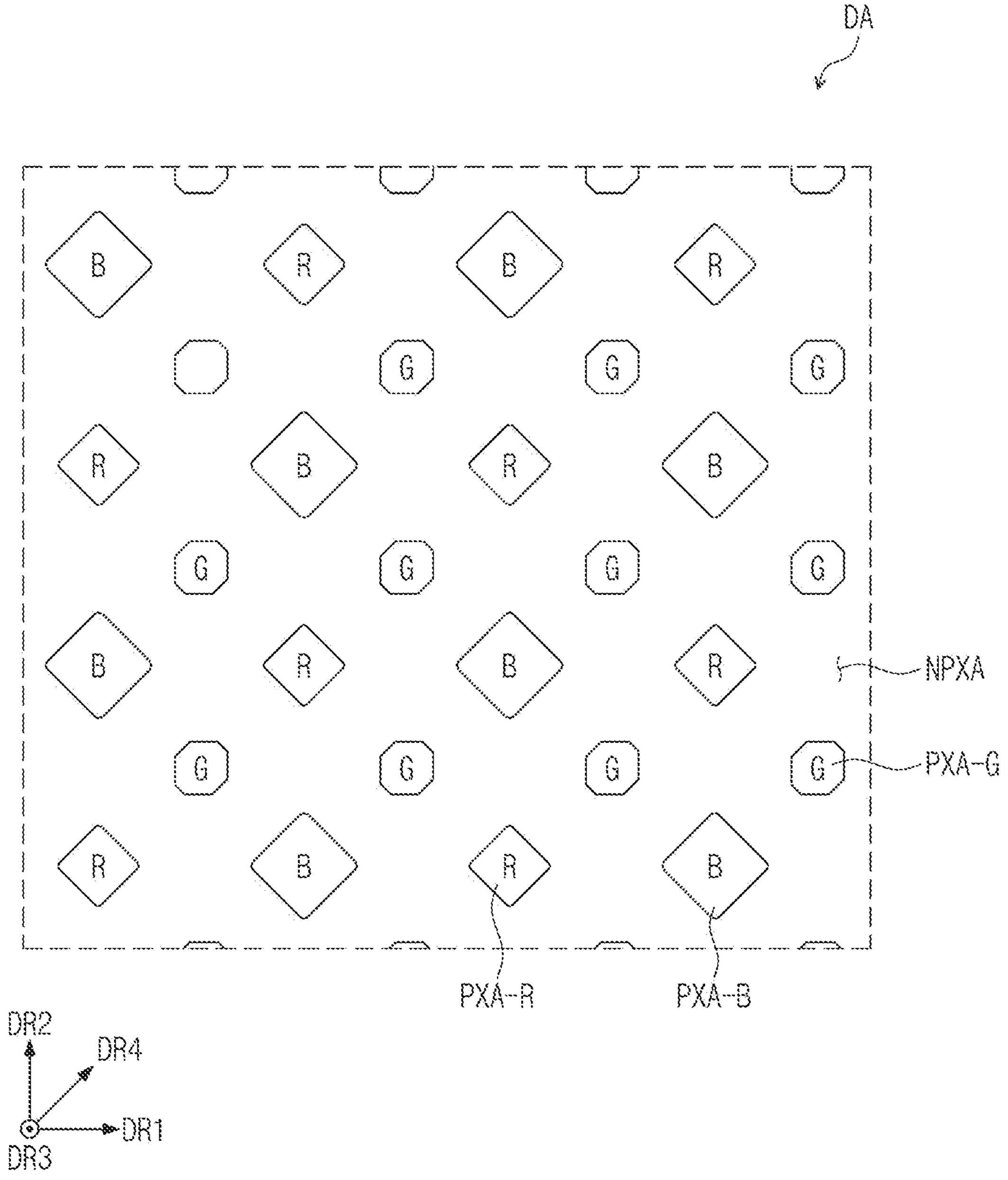
FIG. 5 is an enlarged plan view illustrating a portion of a display region of a display panel according to some embodiments of the present disclosure.

FIG. 5 is an enlarged plan view illustrating a portion of the display region DA (see FIG. 2) of the display panel DP (see FIG. 2) according to some embodiments of the present disclosure. FIG. 5 illustrates a plane of the display module DM (see FIG. 1B) viewed above the display surface IS (see FIG. 1B) of the display module DM and shows arrangement of light-emitting regions PXA-R, PXA-G, and PXA-B.

Referring to FIG. 5, the display region DA may include first to third light-emitting regions PXA-R, PXA-G, and PXA-B and a peripheral region NPXA surrounding the first to third light-emitting regions PXA-R, PXA-G, and PXA-B. The first to third light-emitting regions PXA-R, PXA-G, and PXA-B may respectively correspond to regions in which light provided from light-emitting elements are emitted. The first to third light-emitting regions PXA-R, PXA-G, and PXA-B may be divided according to a color of light emitted to the outside of the display module DM (see FIG. 2).

The first to third light-emitting regions PXA-R, PXA-G, and PXA-B may respectively provide first- to third-color light having different colors. For example, the first-color light may be red light, the second-color light may be green light, and the third-color light may be blue light. However, examples of the first- to third-color light are not limited to the above example.

The first to third light-emitting regions PXA-R, PXA-G, and PXA-B each may be defined as a region in which an upper surface of an anode is exposed by an emission opening that will be described later. The peripheral region NPXA may set a boundary between the first to third light-emitting regions PXA-R, PXA-G, and PXA-B and prevent or reduce color mixing between the first to third light-emitting regions PXA-R, PXA-G, and PXA-B.

The first to third light-emitting regions PXA-R, PXA-G, and PXA-B each may be provided in plurality and repeatedly arranged in an array arrangement, configuration, or form (e.g., a set or predetermined array form) in the display region DA. For example, the first and third light-emitting regions PXA-R and PXA-B may be alternately arranged along the first direction DR1 so as to form a “first group”. The second light-emitting regions PXA-G may be arranged along the first direction DR1 so as to form a “second group”. The “first group” and “second group” each may be provided in plurality, and the “first groups” and “second groups” may be alternately arranged along the second direction DR2.

A single second light-emitting region PXA-G may be arranged spaced apart from a single first light-emitting region PXA-R or a single third light-emitting region PXA-B in a fourth direction DR4. The fourth direction DR4 may be defined as a direction between the first and second directions DR1 and DR2.

Meanwhile, FIG. 5 illustrates an example arrangement form of the first to third light-emitting regions PXA-R, PXA-G, and PXA-B, but the first to third light-emitting regions PXA-R, PXA-G, and PXA-B are not limited thereto and may be arranged in various forms. According to some embodiments, the first to third light-emitting regions PXA-R, PXA-G, and PXA-B may have a pentile (PENTILE™) arrangement form as illustrated in FIG. 5. Alternatively, the first to third light-emitting regions PXA-R, PXA-G, and PXA-B may have a stripe arrangement form or diamond (Diamond Pixel™) arrangement form.

The first to third light-emitting regions PXA-R, PXA-G, and PXA-B may have various forms in a plan view. For example, the first to third light-emitting regions PXA-R, PXA-G, and PXA-B may have a polygonal shape, circular shape, elliptical shape, or the like. FIG. 5 illustrates the first and third light-emitting regions PXA-R and PXA-B having a rectangular shape (or rhombic shape) and the second light-emitting region PXA-G having an octagonal shape in a plan view, as an example, but embodiments are not limited thereto.

The first to third light-emitting regions PXA-R, PXA-G, and PXA-B may have the same shape or at least partially have different shapes in a plan view. FIG. 5 illustrates the first and third light-emitting regions PXA-R and PXA-B having the same shape and the second light-emitting region PXA-G having a shape different from the shapes of the first and third light-emitting regions PXA-R and PXA-B in a plan view, as an example, but embodiments according to the present disclosure are not limited thereto.

At least a portion of the first to third light-emitting regions PXA-R, PXA-G, and PXA-B may have a different area size in a plan view. According to some embodiments, an area size of the first light-emitting region PXA-R emitting red light may be larger than an area size of the second light-emitting region PXA-G emitting green light and smaller than an area size of the third light-emitting region PXA-B emitting blue light. However, an area size relationship between the first to third light-emitting regions PXA-R, PXA-G, and PXA-B according to an emitted light color is not limited thereto, and may be varied according to a design of the display module DM (see FIG. 2). Furthermore, embodiments according to the present disclosure are not limited thereto, and the first to third light-emitting regions PXA-R, PXA-G, and PXA-B may have the same size in a plan view.

Meanwhile, the shapes, area sizes, and arrangement of the first to third light-emitting regions PXA-R, PXA-G, and PXA-B of the display module DM (see FIG. 2) of embodiments according to the present disclosure may be variously designed according to color of emitted light, or a size or configuration of the display module DM (see FIG. 2), and are not limited to the embodiments illustrated with respect to FIG. 5.

Figure 6:
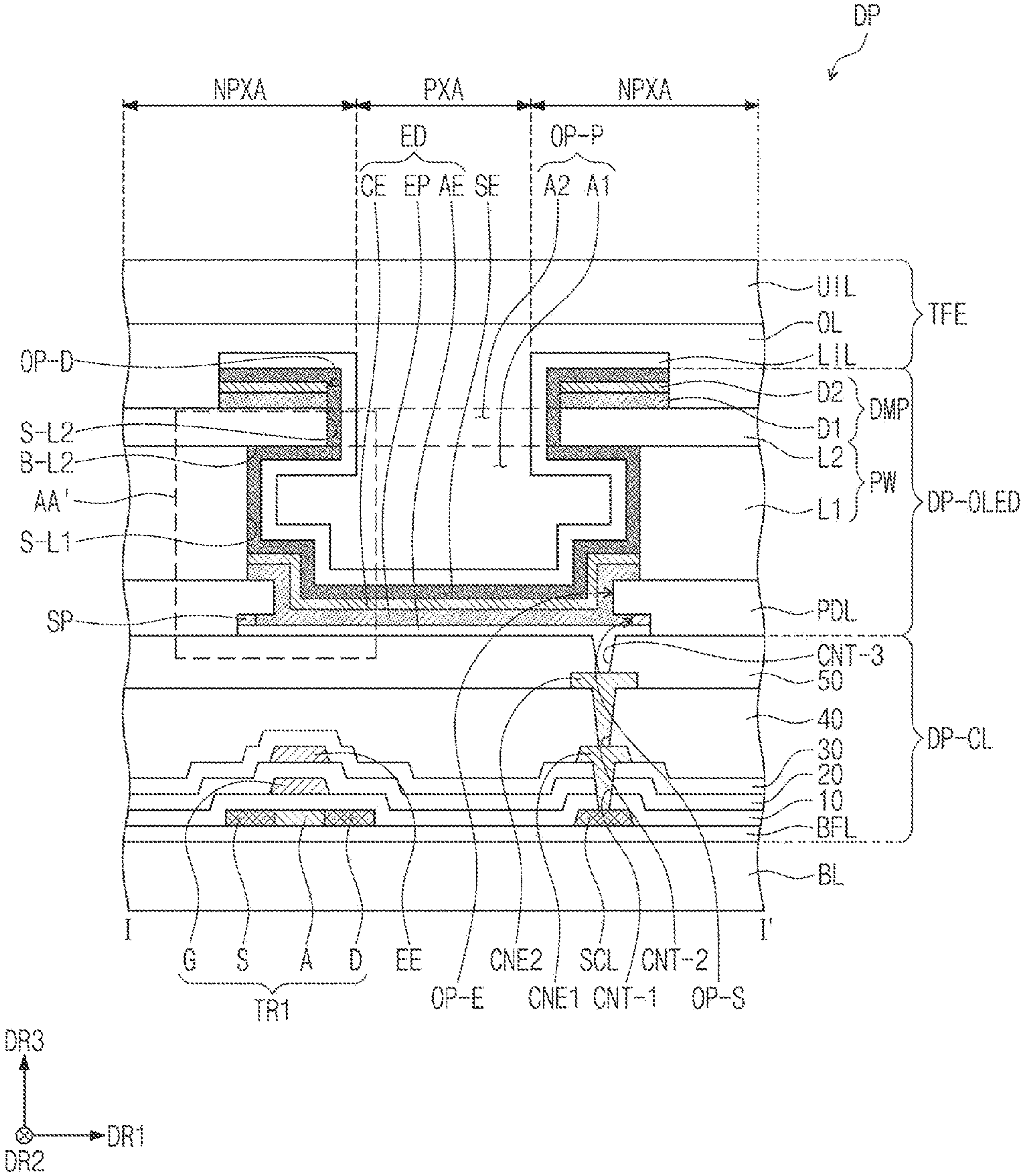
FIG. 6 is a cross-sectional view of the display panel according to some embodiments of the present disclosure taken along the line I-I of FIG. 3.

FIG. 6 is a cross-sectional view of the display panel according to some embodiments of the present disclosure taken along the line I-I of FIG. 3. Descriptions 1 of FIG. 6 will be provided with reference to FIG. 2, and descriptions for the same reference numerals will not be provided.

FIG. 6 is an enlarged view of one light-emitting region PXA in the display region DA (see FIG. 5), and the light-emitting region PXA of FIG. 6 may correspond to any one of the first to third light-emitting regions PXA-R, PXA-G, and PXA-B of FIG. 5. Referring to FIG. 6, the display panel DP may include the base layer BL, the circuit element layer DP-CL, the display element layer DP-OLED, and the thin-film encapsulation layer TFE.

The display panel DP may include a plurality of insulating layers, a semiconductor pattern, a conductive pattern, a signal line, and the like. An insulating layer, a semiconductor layer, and a conductive layer are formed through coating, deposition, or the like. Thereafter, the insulating layer, the semiconductor layer, and the conductive layer may be selectively patterned through photolithography. In this manner, semiconductor patterns, conductive patterns, signal lines, etc. included in the circuit element layer DP-CL and the display element layer DP-OLED may be formed.

The circuit element layer DP-CL may be arranged on the base layer BL. The circuit element layer DP-CL may include a buffer layer BFL, a transistor TR1, a signal transfer region SCL, first to fifth insulating layers 10 to 50, an electrode EE, and a plurality of connection electrodes CNE1 and CNE2.

The buffer layer BFL may be arranged on the base layer BL. The buffer layer BFL may improve a bonding force between the base layer BL and a semiconductor pattern. The buffer layer BFL may include a silicon oxide layer and a silicon nitride layer. The silicon oxide layers and the silicon nitride layers may be stacked alternately.

A semiconductor pattern may be arranged on the buffer layer BFL. The semiconductor pattern may include polysilicon. However, embodiments according to the present disclosure are not limited thereto, and, thus, the semiconductor pattern may include amorphous silicon or metal oxide. FIG. 6 illustrates some semiconductor 1 patterns, and other semiconductor patterns may be further arranged in the plurality of light-emitting regions PXA-R, PXA-G, and PXA-B (see FIG. 5), according to some embodiments, but embodiments according to the present disclosure are not limited thereto. Semiconductor patterns may be arranged over the plurality of light-emitting regions PXA-R, PXA-G, and PXA-B according to a particular rule. The semiconductor patterns may have different electric properties according to whether the semiconductor patterns are doped. The semiconductor patterns may include a first region having a high doping concentration and a second region having a low doping concentration. The first region may be doped with an N-type dopant or P-type dopant. A P-type transistor may include the first region doped with a P-type dopant.

The first region has higher conductivity than that of the second region, and substantially functions as an electrode or a signal line. The second region may substantially correspond to an active (or channel) of a transistor. In other words, a portion of the semiconductor pattern may be an active of a transistor, another portion may be a source or drain of the transistor, and another portion may be a conductive region.

A source S, an active A, and a drain D of the transistor TR1 may be formed from a semiconductor pattern. FIG. 6 illustrates a portion of the signal transfer region SCL formed from a semiconductor pattern. According to some embodiments, the signal transfer region SCL may be connected to the drain D of the transistor TR1 in a plan view.

The first to fifth insulating layers 10 to 50 may be arranged on the buffer layer BFL. The first to fifth insulating layers 10 to 50 may include an organic layer or an inorganic layer.

The first insulating layer 10 may be arranged on the buffer layer BFL. The first insulating layer 10 may cover the signal transfer region SCL and the source S, active A, and drain D of the transistor TR1 arranged on the buffer layer BFL. The gate G of the transistor TR1 may be arranged on the first insulating layer 10. The second insulating layer 20 may be arranged on the first insulating layer 10 and may cover the gate G. The electrode EE may be arranged on the second insulating layer 20. The third insulating layer 30 may be arranged on the second insulating layer 20 and may cover the electrode EE.

A first connection electrode CNE1 may be arranged on the third insulating layer 30. The first connection electrode CNE1 may be connected to the signal transfer region SCL through a contact hole CNT-1 penetrating the first to third insulating layers 10 to 30. The fourth insulating layer 40 may be arranged on the third insulating layer 30 and may cover the first connection electrode CNE1. The fourth insulating layer 40 may be an organic layer.

A second connection electrode CNE2 may be arranged on the fourth insulating layer 40. The second connection electrode CNE2 may be connected to the first connection electrode CNE1 through a contact hole CNT-2 penetrating the fourth insulating layer 40. The fifth insulating layer 50 may be arranged on the fourth insulating layer 40 and may cover the second connection electrode CNE2. The fifth insulating layer 50 may be an organic layer.

The display element layer DP-OLED may be arranged on the circuit element layer DP-CL. The display element layer DP-OLED may include the light-emitting element ED, a sacrificial pattern SP, a pixel defining layer PDL, a partition wall PW, an auxiliary electrode SE, and dummy patterns DMP.

The light-emitting element ED may include an anode AE (or first electrode), a light-emitting pattern EP, and a cathode CE (or second electrode).

The anode AE may be arranged on the fifth insulating layer 50 of the circuit element layer DP-CL. The anode AE may be a transmissive electrode, a transflective electrode, or a reflective electrode. The anode AE may be connected to the second connection electrode CNE2 by a connection contact hole CNT-3 defined by penetrating the fifth insulating layer 50. Therefore, the anode AE may be electrically connected to the signal transfer region SCL through the first and second connection electrodes CNE1 and CNE2 so as to be electrically connected to a corresponding circuit element. The anode AE may include a single-layer or multi-layer structure. The anode AE may include a plurality of layers including ITO and Ag. For example, the anode AE may include a layer including ITO (hereinafter, lower ITO layer), a layer including Ag (hereinafter, Ag layer) arranged on the lower ITO layer, and a layer including ITO (hereinafter, upper ITO layer) arranged on the Ag layer.

The sacrificial pattern SP may be arranged between the anode AE and the pixel defining layer PDL. A sacrificial opening OP-S exposing a portion of an upper surface of the anode AE may be defined in the sacrificial pattern SP. The sacrificial opening OP-S may overlap an emission opening OP-E that will be described later.

The pixel defining layer PDL may be arranged on the fifth insulating layer 50 of the circuit element layer DP-CL. The emission opening OP-E may be defined in the pixel defining layer PDL. The emission opening OP-E may correspond to the anode AE, and the pixel defining layer PDL may expose at least a portion of the anode AE through the emission opening OP-E.

Furthermore, the emission opening OP-E may correspond to the sacrificial opening OP-S of the sacrificial pattern SP. According to some embodiments, the upper surface of the anode AE may be spaced apart from the pixel defining layer PDL with the sacrificial pattern SP therebetween in a cross-sectional view, and thus the anode AE may be protected from being damaged during a forming process of the emission opening OP-E.

In a plan view, an area size of the emission opening OP-E may be less than an area size of the sacrificial opening OP-S. That is, an inner surface of the pixel defining layer PDL defining the emission opening OP-E may be closer to a center of the anode AE than an inner surface of the sacrificial pattern SP defining the sacrificial opening OP-S. However, embodiments according to the present disclosure are not limited thereto, and the inner surface of the sacrificial pattern SP defining the sacrificial opening OP-S may be substantially aligned with the inner surface of the pixel defining layer PDL defining the emission opening OP-E. Here, the light-emitting region PXA may be regarded as a region of the anode AE exposed from the corresponding sacrificial opening OP-S.

The pixel defining layer PDL may include an inorganic insulating material. For example, the pixel defining layer PDL may include a silicon nitride (SiNx). The pixel defining layer PDL may be arranged between the anode AE and the partition wall PW so as to block the anode AE and the partition wall PW from being electrically connected to each other.

The light-emitting pattern EP may be arranged on the anode AE. The light-emitting pattern EP may include an emission layer including a light-emitting material. The light-emitting pattern EP may further include a hole injection layer (HIL) and a hole transport layer (HTL) arranged between the anode AE and the emission layer, and may further include an electron transport layer (ETL) and an electron injection layer (EIL) arranged on the emission layer. The light-emitting pattern EP may be referred to as an "organic layer" or "intermediate layer".

The light-emitting pattern EP may be patterned by a tip portion defined on the partition wall PW. The light-emitting pattern EP may be arranged inside the sacrificial opening OP-S, the emission opening OP-E, and a partition wall opening OP-P. The light-emitting pattern EP may cover a portion of an upper surface of the pixel defining layer PDL exposed from the partition wall opening OP-P.

The cathode CE may be arranged on the light-emitting pattern EP. The cathode CE may be patterned by the tip portion defined on the partition wall PW. At least a portion of the cathode CE may be arranged in the partition wall opening OP-P. The cathode CE may contact a first inner surface S-L1 of a first partition wall layer L1. The cathode CE may have conductivity. The cathode CE may be formed of various materials such as metal, transparent conductive oxide (TCO), or conductive polymer material provided that the cathode CE has conductivity. For example, the cathode CE may include silver (Ag), magnesium (Mg), lead (Pu), copper (Cu), or a compound thereof.

The partition wall PW may be arranged on the pixel defining layer PDL. The partition wall opening OP-P may be defined in the partition wall PW. The partition wall opening OP-P may correspond to the emission opening OP-E, and may expose at least a portion of the anode AE.

The partition wall PW may have an undercut shape in a cross-sectional view. The partition wall PW may include a plurality of layers sequentially laminated, and at least one of the plurality of layers may be recessed compared to the other layers. Accordingly, the partition wall PW may include a tip portion.

The partition wall PW may include the first partition wall layer L1 and a second partition wall layer L2. The first partition wall layer L1 may be arranged on the pixel defining layer PDL, and the second partition wall layer L2 may be arranged on the first partition wall layer L1. As illustrated in FIG. 6, a thickness of the first partition wall layer L1 may be larger than a thickness of the second partition wall layer L2, but is not limited thereto.

The first partition wall layer L1 may be recessed with respect to the light-emitting region PXA compared to the second partition wall layer L2. The first partition wall layer L1 may be formed by being undercut with respect to the second partition wall layer L2. A portion of the second partition wall layer L2 protruding over the first partition wall layer L1 toward the light-emitting region PXA may be defined as a tip portion in the partition wall PW.

The partition wall opening OP-P defined in the partition wall PW may include a first region A1 and a second region A2. The first partition wall layer L1 may include the first inner surface S-L1 defining the first region A1 of the partition wall opening OP-P, and the second partition wall layer L2 may include a second inner surface S-L2 defining the second region A2. In a cross-sectional view, the second inner surface S-L2 of the second partition wall layer L2 may be closer to the center of the anode AE 1 than the first inner surface S-L1 of the first partition wall layer L1. The first inner surface S-L1 may be farther away from the center of the anode AE than the second inner surface S-L2. Accordingly, the second partition wall layer L2 may include a tip portion protruding toward the light-emitting region PXA.

A width of the first region A1 may be different from a width of the second region A2. The width of the first region A1 may be larger than the width of the second region A2. In this case, the second region A2 of the partition wall opening OP-P may be a region in which the tip portion is defined.

The first partition wall layer L1 and the second partition wall layer L2 each may include a conductive material. For example, the conductive material may include metal, transparent conductive oxide (TCO), or combinations thereof. For example, the metal may include gold (Au), silver (Ag), aluminum (Al), magnesium (Mg), lithium (Li), molybdenum (Mo), titanium (Ti), Copper (Cu), or alloy. The transparent conductive oxide may include indium tin oxide (ITO), indium zinc oxide (IZO), zinc oxide, indium oxide, indium gallium oxide, indium gallium zinc oxide (IGZO), or aluminum zinc oxide.

FIG. 6 illustrates that the first inner surface S-L1 and the second inner surface S-L2 each are perpendicular to the upper surface of the pixel defining layer PDL, but embodiments according to the present disclosure are not limited thereto. For example, the partition wall PW may have a tapered shape or an inversely tapered shape.

The partition wall PW may receive the second driving voltage ELVSS (see FIG. 4), and, accordingly, the cathode CE may be electrically connected to the partition wall PW and receive the second driving voltage ELVSS (see FIG. 3B).

The auxiliary electrode SE may be arranged on the light-emitting element ED. For example, the auxiliary electrode SE may be arranged on the cathode CE. The auxiliary electrode SE may extend along the first inner surface S-L1 of the first partition wall layer L1, a lower surface B-L2 of the second partition wall layer L2, and the second inner surface S-L2 of the second partition wall layer L2. At least a portion of the auxiliary electrode SE may be arranged in the partition wall opening OP-P, and another portion of the auxiliary electrode SE may be arranged on the partition wall PW.

The auxiliary electrode SE may have conductivity. The auxiliary electrode SE may include a transparent conductive oxide (TCO). For example, the auxiliary electrode SE may include an indium tin oxide (ITO) or indium zinc oxide (IZO). However, the auxiliary electrode SE is not limited thereto and may be formed of various materials such as a conductive polymer material provided that the auxiliary electrode SE has conductivity.

Although FIG. 6 illustrates that the auxiliary electrode SE extends up to an upper surface of the second partition wall layer L2 along the first inner surface S-L1 of the first partition wall layer L1, the lower surface B-L2 of the second partition wall layer L2, and the second inner surface S-L2 of the second partition wall layer L2, embodiments according to the present disclosure are not limited thereto. For example, the auxiliary electrode SE may extend only to the first inner surface S-L1 of the first partition wall layer L1, the lower surface B-L2 of the second partition wall layer L2, and a portion of the second inner surface S-L2 or only to the first inner surface S-L1 of the first partition wall layer L1 and a portion of the lower surface B-L2 of the second partition wall layer L2.

The dummy patterns DMP may be arranged on the partition wall PW. The dummy patterns DMP may include a first dummy pattern D1 and a second dummy pattern D2. The first and second dummy patterns D1 and D2 may be sequentially arranged on an upper surface of the second partition wall layer L2 of the partition wall PW in the third direction DR3.

The first dummy pattern D1 may include an organic material. For example, the first dummy pattern D1 may include the same material as the light-emitting pattern EP. The first dummy pattern D1 may be simultaneously formed with the light-emitting pattern EP through a single process, and may be formed separately from the light-emitting pattern EP due to the undercut shape of the partition wall PW.

The second dummy pattern D2 may include a conductive material. For example, the second dummy pattern D2 may include the same material as the cathode CE. The second dummy pattern D2 may be simultaneously formed with the cathode CE through a single process, and may be formed separately from the cathode CE due to the undercut shape of the partition wall PW.

A dummy opening OP-D may be defined in the dummy patterns DMP. The dummy opening OP-D may correspond to the emission opening OP-E. The dummy opening OP-D may include first and second regions sequentially arranged in the third direction DR3. A first region AA1 (see FIG. 10F) of the dummy opening OP-D may be defined by an inner surface of the first dummy pattern D1, and a second region AA2 (see FIG. 10F) may be defined by an inner surface of the second dummy pattern D2. In a plan view, the first and second dummy patterns D1 and D2 each may have a closed-line shape surrounding the light-emitting region PXA.

Although FIG. 6 illustrates that the inner surfaces of the first and second dummy patterns D1 and D2 are aligned with the second inner surface S-L2 of the second partition wall layer L2, embodiments according to the present disclosure are not limited thereto, and the first and second dummy patterns D1 and D2 may cover the second inner surface S-L2 of the second partition wall layer L2.

The thin-film encapsulation layer TFE may be arranged on the display element layer DP-OLED. The thin-film encapsulation layer TFE may include a lower encapsulation inorganic pattern LIL, an encapsulation organic layer OL, and an upper encapsulation inorganic layer UIL.

The lower encapsulation inorganic pattern LIL may correspond to the emission opening OP-E. The lower encapsulation inorganic pattern LIL may cover the auxiliary electrode SE, and may be partially arranged inside the partition wall opening OP-P. The encapsulation organic layer OL may cover the lower encapsulation inorganic pattern LIL and may provide a flat upper surface. The upper encapsulation inorganic layer UIL may be arranged on the encapsulation organic layer OL.

The lower encapsulation inorganic pattern LIL and the upper encapsulation inorganic layer UIL may protect the display element layer DP-OLED from moisture/oxygen, and the encapsulation organic layer OL may protect the display element layer DP-OLED from foreign matter such as particles of dust.

Figure 7:
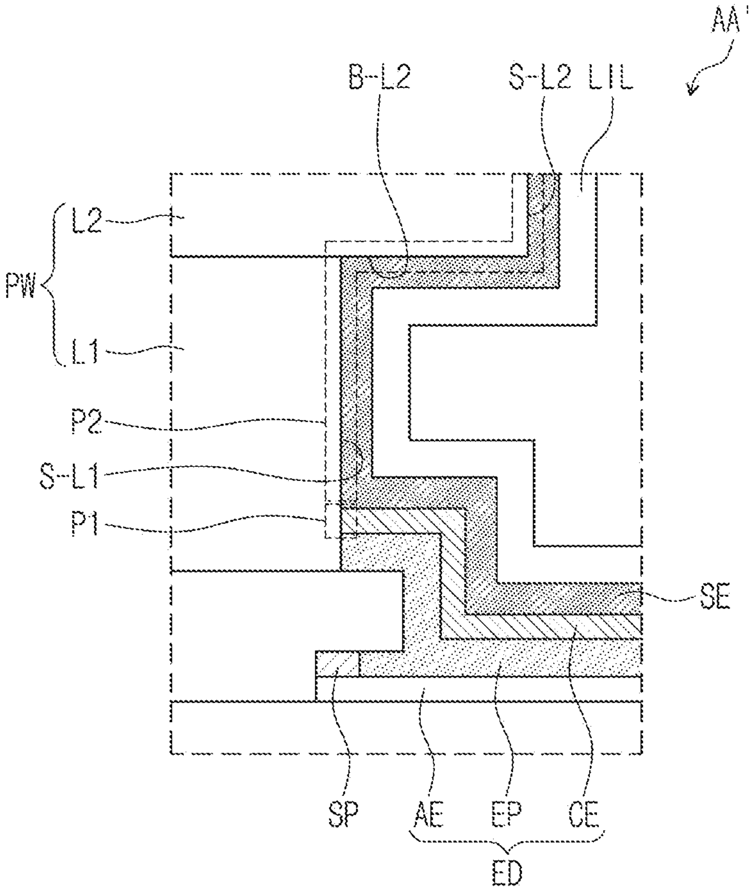
FIG. 7 is an enlarged view of the region AA' of FIG. 6.

FIG. 7 is an enlarged view of the region AA' of FIG. 6.

Referring to FIGS. 6 and 7, the light-emitting pattern EP and the cathode CE may contact the first inner surface S-L1 of the first partition wall layer L1, and the auxiliary electrode SE may contact the first inner surface S-L1 of the first partition wall layer L1, the lower surface B-L2 of the second partition wall layer L2, and the second inner surface S-L2 of the second partition wall layer L2. The partition wall PW may include a first portion P1 that the cathode CE contacts and a second portion P2 that the auxiliary electrode SE contacts. An area size of the second portion P2 may be larger than an area size of the first portion P1. The auxiliary electrode SE may cover the cathode CE.

The lower encapsulation inorganic pattern LIL may be arranged on the auxiliary electrode SE. The lower encapsulation inorganic pattern LIL may directly contact the auxiliary electrode SE. For example, the lower encapsulation inorganic pattern LIL may directly contact the auxiliary electrode SE in the partition wall opening OP-P.

Adhesive strength between the auxiliary electrode SE and the cathode CE and adhesive strength between the auxiliary electrode SE and the lower encapsulation inorganic pattern LIL may be higher than adhesive strength between the lower encapsulation inorganic pattern LIL and the cathode CE. According to some embodiments of the present disclosure, because the auxiliary electrode SE is arranged between the lower encapsulation inorganic pattern LIL and the cathode CE, the lower encapsulation inorganic pattern LIL and the cathode CE may not contact each other. Because the lower encapsulation inorganic pattern LIL is stably coupled to the auxiliary electrode SE, floating of the lower encapsulation inorganic pattern LIL may be reduced or avoided. Therefore, instances of foreign matter or contaminants permeating the display element layer DP-OLED may be prevented or reduced.

Figure 8:
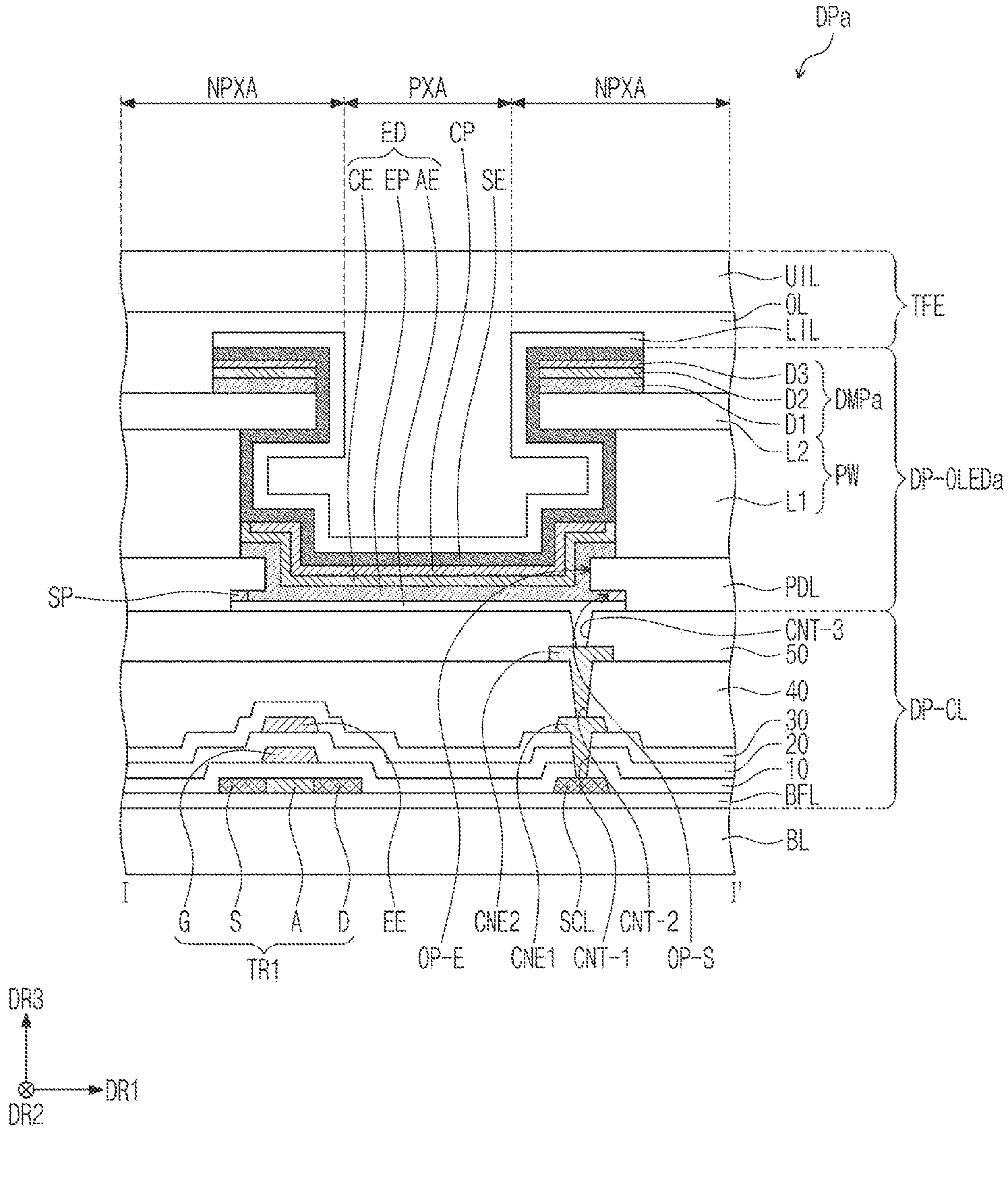
FIG. 8 is a cross-sectional view of the display panel according to some embodiments of the present disclosure taken along the line I-I of FIG. 3.

FIG. 8 is a cross-sectional view of the display panel according to some embodiments of the present disclosure taken along the line I-I of FIG. 3. In describing FIG. 8, the same/similar reference signs are used for the same/similar components described with reference to FIGS. 6 and 7, and overlapping descriptions will not be provided.

Referring to FIG. 8, a display panel DPa may include the base layer BL, the circuit element layer DP-CL, a display element layer DP-OLEDa, and the thin-film encapsulation layer TFE. The display element layer DP-OLEDa may include the light-emitting element ED, the sacrificial pattern SP, the pixel defining layer PDL, the partition wall PW, the auxiliary electrode SE, dummy patterns DMPa, and a capping pattern CP. That is, the display panel DPa of FIG. 8 may further include the capping pattern CP compared to the display panel DP of FIG. 6.

The capping pattern CP may be arranged in the partition wall opening OP-P and on the cathode CE. That is, the cathode CE, the capping pattern CP, and the auxiliary electrode SE may be sequentially laminated along a thickness direction of the base layer BL. The capping pattern CP may be patterned by the tip portion formed on the partition wall PW.

Although FIG. 8 illustrates that the capping pattern CP does not contact the first inner surface S-L1 of the first partition wall layer L1, embodiments according to the present disclosure are not limited thereto. For example, the capping pattern CP may be formed so as to contact the first inner surface S-L1 of the first partition wall layer L1.

The dummy patterns DMPa may include a first dummy pattern D1, a second dummy pattern D2, and a third dummy pattern D3. The first to third dummy patterns D1 to D3 may be sequentially arranged on the upper surface of the second partition wall layer L2 of the partition wall PW in the third direction DR3. A portion of the auxiliary electrode SE may be arranged on the third dummy pattern D3. The dummy 1 patterns DMPa of FIG. 8 may further include the third dummy pattern D3 compared to the dummy patterns DMP of FIG. 6.

The third dummy pattern D3 may include a conductive material. For example, the third dummy pattern D3 may include the same material as the capping pattern CP. The third dummy pattern D3 may be simultaneously formed with the capping pattern CP through a single process, and may be formed separately from the capping pattern CP due to the undercut shape of the partition wall PW.

Figure 9:
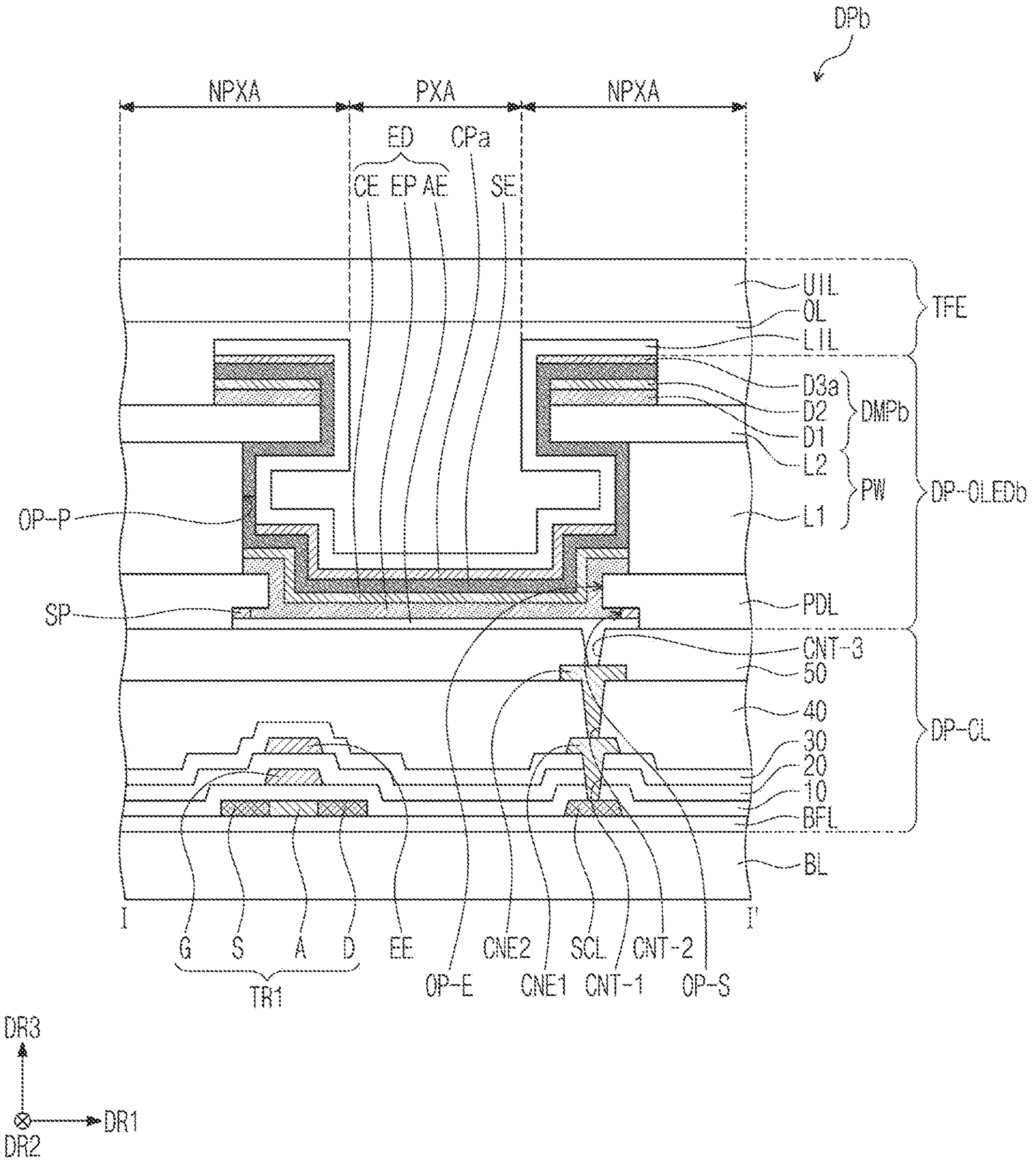
FIG. 9 is a cross-sectional view of the display panel according to some embodiments of the present disclosure taken along the line I-I of FIG. 3.

FIG. 9 is a cross-sectional view of the display panel according to some embodiments of the present disclosure taken along the line I-I of FIG. 3. In describing FIG. 9, the same/similar reference signs are used for the same/similar components described with reference to FIGS. 6 and 7, and overlapping descriptions will not be provided.

Referring to FIG. 9, a display panel DPb may include the base layer BL, the circuit element layer DP-CL, a display element layer DP-OLEDb, and the thin-film encapsulation layer TFE. The display element layer DP-OLEDb may include the light-emitting element ED, the sacrificial pattern SP, the pixel defining layer PDL, the partition wall PW, the auxiliary electrode SE, dummy patterns DMPb, and a capping pattern CPa. That is, the display panel DPb of FIG. 9 may further include the capping pattern CPa compared to the display panel DP of FIG. 6.

The capping pattern CPa may be arranged in the partition wall opening OP-P and on the cathode CE. That is, the cathode CE, the auxiliary electrode SE, and the capping pattern CPa may be sequentially laminated along a thickness direction of the base layer BL. The capping pattern CPa may be patterned by the tip portion formed on the partition wall PW.

The dummy patterns DMPb may include a first dummy pattern D1, a second dummy pattern D2, and a third dummy pattern D3*a*. The first dummy pattern D1, the second dummy pattern D2, and the third dummy pattern D3*a* may be sequentially arranged on the upper surface of the second partition wall layer L2 of the partition wall PW in the third direction DR3. A portion of the auxiliary electrode SE may be arranged between the second dummy pattern D2 and the third dummy pattern D3*a*. The dummy patterns DMPb of FIG. 9 may further include the third dummy pattern D3*a* arranged on the auxiliary electrode SE compared to the dummy patterns DMP of FIG. 6.

The third dummy pattern D3*a* may include a conductive material. For example, the third dummy pattern D3*a* may include the same material as the capping pattern CPa. The third dummy pattern D3*a* may be simultaneously formed with the capping pattern CPa through a single process, and may be formed separately from the capping pattern CPa due to the undercut shape of the partition wall PW.

FIGS. 10A to 10J are cross-sectional views partially illustrating a method for manufacturing a display panel according to some embodiments of the present disclosure. In describing FIGS. 10A to 10J, the same/similar reference signs are used for the same/similar components described with reference to FIGS. 1 to 9, and overlapping descriptions will not be provided.

A method for manufacturing a display panel according to some embodiments of the present disclosure may include providing a preliminary display panel including a base layer, a pixel defining layer arranged on the base layer, a first preliminary partition wall layer arranged on the pixel defining layer, and a second preliminary partition wall layer arranged on the first preliminary partition wall layer, forming a first partition wall layer and a second partition wall layer in which a partition wall opening is formed by etching the first preliminary partition wall layer and the second preliminary partition wall layer, forming a light-emitting pattern and a cathode contacting the first partition wall layer in the partition wall opening, and forming, on the cathode, an auxiliary electrode extending along a first inner surface of the first partition wall layer, a lower surface of the second partition wall layer, and a second inner surface of the second partition wall layer.

Hereinafter, a method for forming one light-emitting element ED, the lower encapsulation inorganic pattern LIL covering the light-emitting element ED, the encapsulation organic layer OL, and the upper encapsulation inorganic layer UIL will be described with reference to FIGS. 10A to 10J. A display panel formed through the method illustrated in FIGS. 10A to 10J may correspond to the display panel DPa of FIG. 8.

Figure 10A:
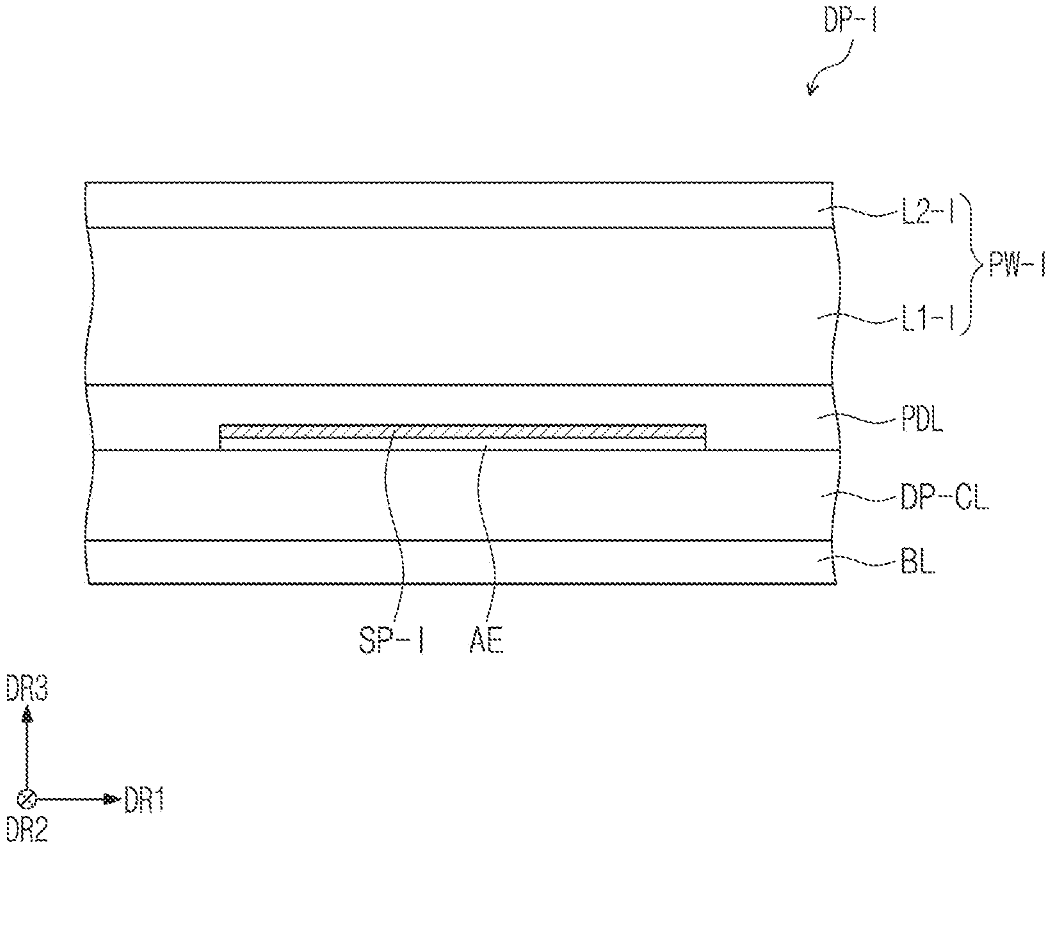
FIGS. 10A to 10J are cross-sectional views partially illustrating a method for manufacturing a display panel according to some embodiments of the present disclosure.

Referring to FIG. 10A, the method for manufacturing a display panel according to some embodiments may include providing a preliminary display panel DP-I. The preliminary display panel DP-I provided in the present embodiments may include the base layer BL, the circuit element layer DP-CL, the anode AE, a preliminary sacrificial pattern SP-I, the pixel defining layer PDL, a first preliminary partition wall layer L1-I, and a second preliminary partition wall layer L2-1.

The circuit element layer DP-CL may be formed through a typical circuit element manufacturing process in which an insulating layer, a semiconductor layer, and a conductive layer are formed through coating, deposition, or the like, and a semiconductor pattern, a conductive pattern, and a signal line are formed by selectively patterning the insulating layer, the semiconductor layer, and the conductive layer through photolithography and etching.

The anode AE and the preliminary sacrificial pattern SP-I may be formed through the same patterning process. The pixel defining layer PDL may be arranged on the base layer BL. The pixel defining layer PDL may cover both the anode AE and the preliminary sacrificial pattern SP-I.

The first preliminary partition wall layer L1-I may be arranged on the pixel defining layer PDL. The first preliminary partition wall layer L1-I may be formed through a deposition process of a conductive material. The second preliminary partition wall layer L2-I may be arranged on the first preliminary partition wall layer L1-1. The second preliminary partition wall layer L2-I may be formed through a deposition process of a conductive material. According to some embodiments, the first preliminary partition wall layer L1-I may include aluminum (Al) or molybdenum (Mo), and the second preliminary partition wall layer L2-I may include titanium (Ti), but materials of the first preliminary partition wall layer L1-I and the second preliminary partition wall layer L2-I are not limited thereto. The first preliminary partition wall layer L1-I and the second preliminary partition wall layer L2-I may form a preliminary partition wall PW-I.

Figure 10B:
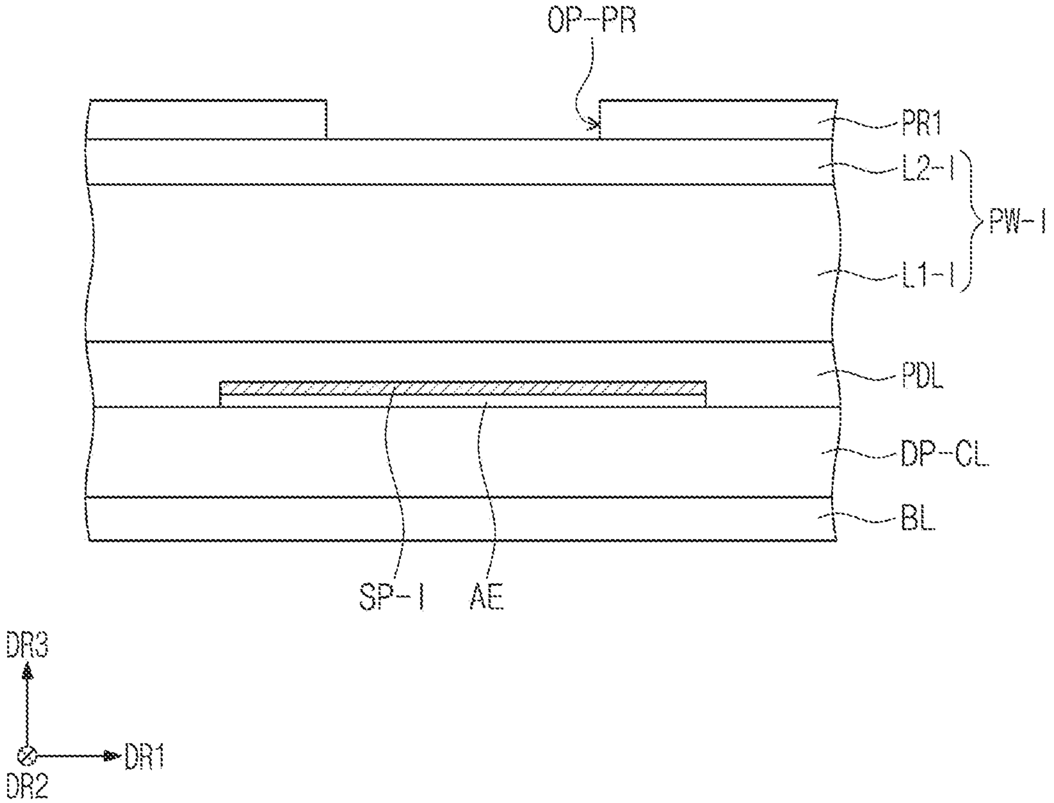

Thereafter, referring to FIG. 10B, the method for manufacturing a display panel according to the present embodiments may include forming a first photoresist layer PR1 on the preliminary partition wall PW-I. The first photoresist pattern PR1 may be formed by forming a preliminary photoresist layer on the preliminary partition wall PW-I and patterning the preliminary photoresist layer using a photomask. A photo opening OP-PR overlapping the anode AE may be formed in the first photoresist layer PR1 through a patterning process.

Figure 10C:
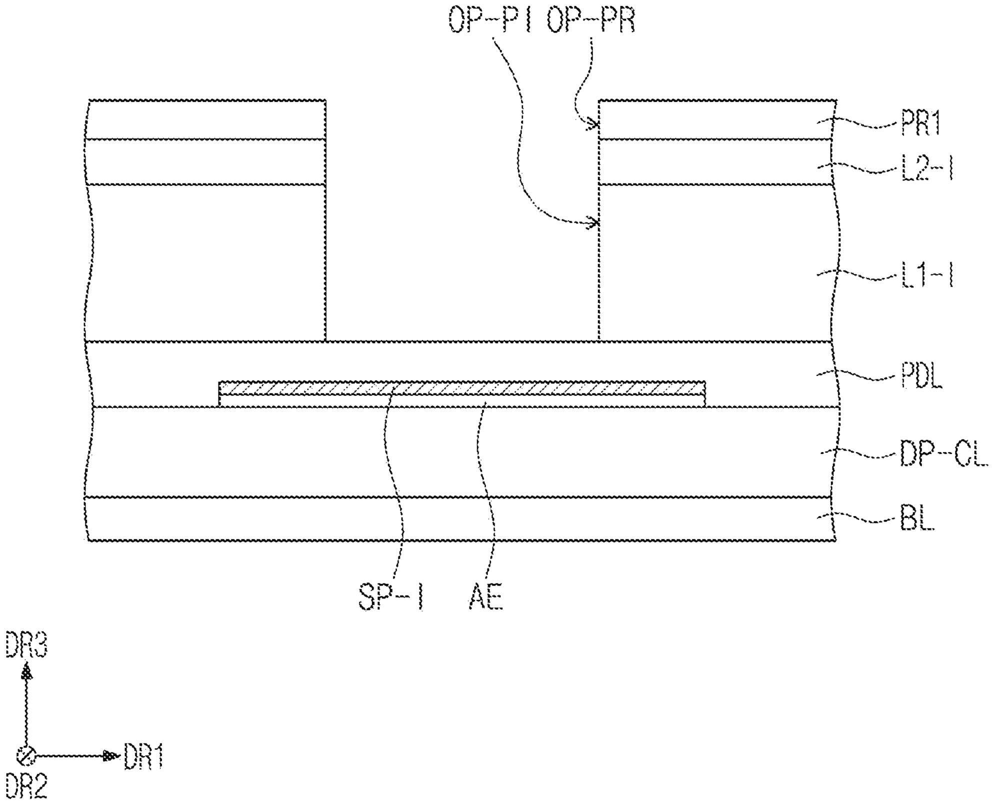
Figure 10D:
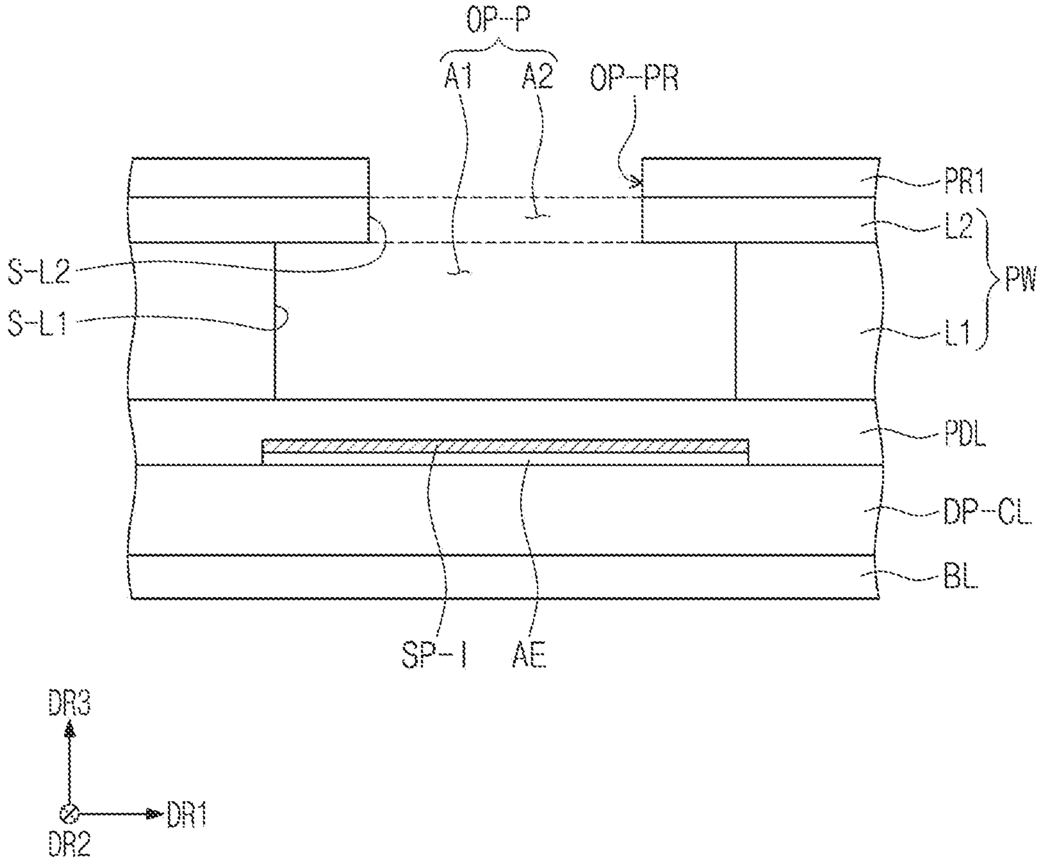

Thereafter, referring to FIGS. 10C and 10D, the method for manufacturing a display panel according to the present embodiments may include forming the first partition wall layer L1 and second partition wall layer L2 in which the partition wall opening OP-P is defined by etching the first preliminary partition wall layer L1-I and the second preliminary partition wall layer L2-I so as to form the partition wall PW from the preliminary partition wall PW-I (see FIG. 10B).

As illustrated in FIG. 10C, primarily etching the first preliminary partition wall layer L1-I and the second preliminary partition wall layer L2-I may include forming a preliminary partition wall opening OP-PI in the preliminary partition wall PW-I (see FIG. 10B) by dry etching the first preliminary partition wall layer L1-I and the second preliminary partition wall layer L2-I using the first photoresist layer PR1 as a mask.

According to some embodiments, a primary dry etching process may be performed in an etching environment in which etch selectivity between the first preliminary partition wall layer L1-I and the second preliminary partition wall layer L2-1 is substantially the same. Accordingly, an inner surface of the first preliminary partition wall layer L1-I and the second preliminary partition wall layer L2-I defining the preliminary partition wall opening OP-PI may be substantially aligned.

Thereafter, as illustrated in FIG. 10D, secondarily etching the first preliminary partition wall layer L1-I may include forming the partition wall opening OP-P from the preliminary partition wall opening OP-PI (see FIG. 10C) by wet etching the first preliminary partition wall layer L1-I using the first photoresist layer PR1 as a mask.

The partition wall opening OP-P may include the first region A1 and the second region A2 sequentially arranged in a thickness direction (i.e., third direction DR3). The first partition wall layer L1 may include the first inner surface S-L1 defining the first region A1 of the partition wall opening OP-P, and the second partition wall layer L2 may include the second inner surface S-L2 defining the second region A2.

According to some embodiments, a secondary wet etching process may be performed in an environment in which etch selectivity between the first preliminary partition wall layer L1-I and the second preliminary partition wall layer L2-I is large. Accordingly, an inner surface of the partition wall PW defining the partition wall opening OP-P may have an undercut shape in a cross-sectional view. For example, because an etch rate of the first partition wall layer L1 for an etching solution is higher than an etch rate of the second partition wall layer L2, the first partition wall layer L1 may be mainly etched. Accordingly, the first inner surface S-L1 of the first partition wall layer L1 may be further recessed inwards compared to the second inner surface S-L2 of the second partition wall layer L2. A tip portion may be formed on the partition wall PW due to a portion of the second partition wall layer L2 protruding over the first partition wall layer L1.

Figure 10E:
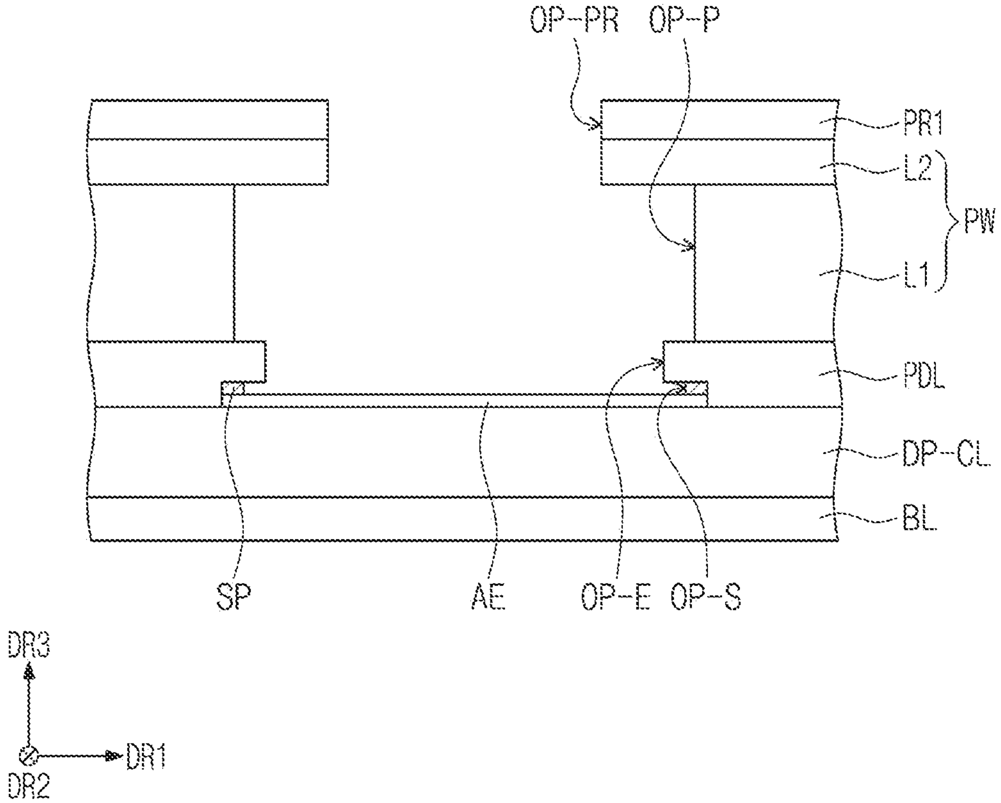

Thereafter, referring to FIG. 10E, the method for manufacturing a display panel according to the present embodiments may include etching the pixel defining layer PDL and etching the preliminary sacrificial pattern SP-I (see FIG. 10D). An etching process of the pixel defining layer PDL may be performed in a dry etching manner, using the first photoresistor layer PR1 and the partition wall PW (e.g., the second partition wall layer L2) as a mask. The emission opening OP-E corresponding to the partition wall opening OP-P may be formed in the pixel defining layer PDL.

An etching process of the preliminary sacrificial pattern SP-I may be performed in a wet etching manner, using the first photoresistor layer PR1 and the partition wall PW (e.g., the second partition wall layer L2) as a mask. The sacrificial opening OP-S overlapping the emission opening OP-E may be formed in the sacrificial pattern SP by etching the preliminary sacrificial pattern SP-I. At least a portion of the anode AE may be exposed from the sacrificial pattern SP and the pixel defining layer PDL due to the sacrificial opening OP-S and the emission opening OP-E.

An etching process of the sacrificial pattern SP may be performed in an environment in which etch selectivity between the sacrificial pattern SP and the anode AE is high, and, in this manner, the anode AE may be prevented from being etched together. That is, the anode AE may be prevented from being etched and damaged during the etching process by arranging the sacrificial pattern SP having a higher etch rate than the anode AE between the pixel defining layer PDL and the anode AE.

Figure 10F:
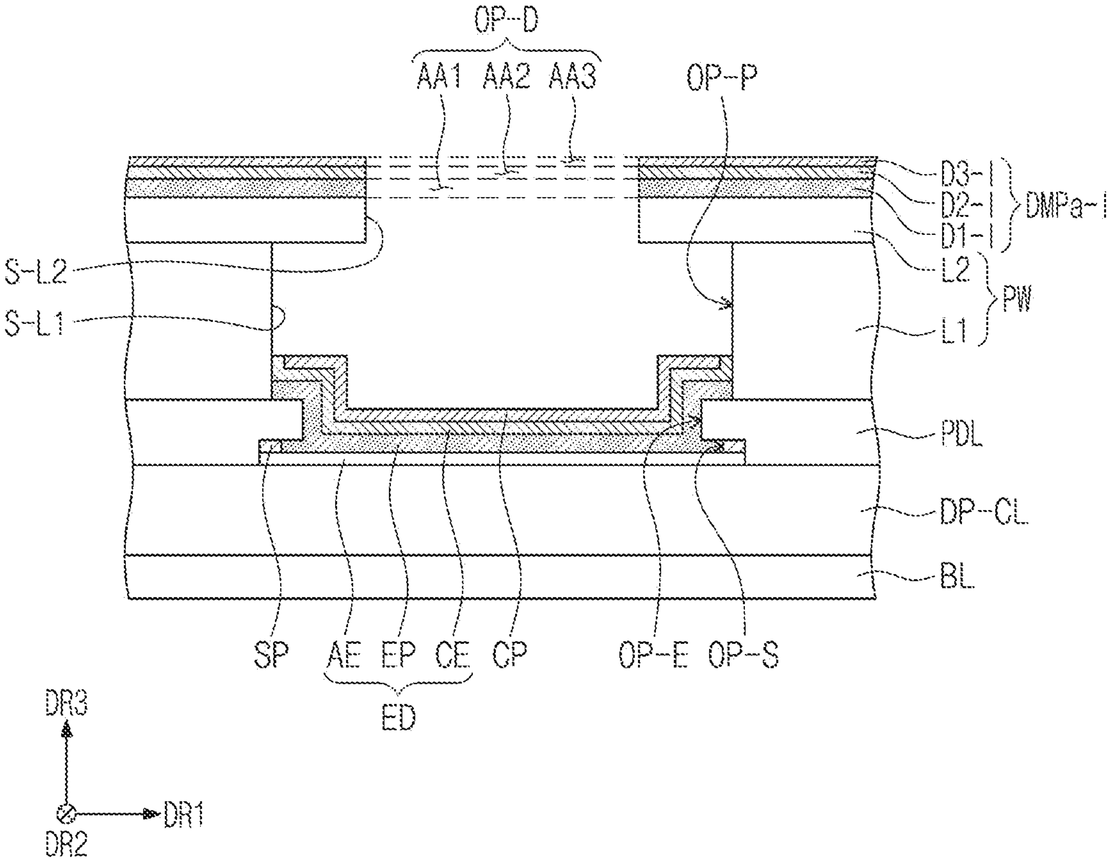

Thereafter, referring to FIG. 10F, the method for manufacturing a display panel according to the present embodiments may include forming the light-emitting pattern EP in the partition wall opening OP-P after removing the first photoresistor layer PR1 (see FIG. 10I), forming the cathode CE contacting the first partition wall layer L1, and forming the capping pattern CP.

The forming of the light-emitting pattern EP, the forming of the cathode CE, and the forming of the capping pattern CP each may be performed through a deposition process. According to some embodiments, the forming of the light-emitting pattern EP may include a thermal evaporation process, the forming of the cathode CE may include a thermal evaporation process, and the forming of the capping pattern CP may include a thermal evaporation process. However, the deposition process of each of the forming of the light-emitting pattern EP and the forming of the capping pattern CP is not limited thereto.

The light-emitting pattern EP may be formed on the anode AE. During the forming of the light-emitting pattern EP, the light-emitting pattern EP may be separated 1 by the tip portion formed on the partition wall PW and arranged in the emission opening OP-E and the partition wall opening OP-P. During the forming of the light-emitting pattern EP, a first dummy layer D1-I spaced apart from the light-emitting pattern EP may be formed together on the partition wall PW.

The cathode CE may be formed on the light-emitting pattern EP. During the forming of the cathode CE, the cathode CE may be separated by the tip portion formed on the partition wall PW and arranged in the partition wall opening OP-P. The cathode CE may be provided at a high incident angle and may be formed in contact with the first inner surface S-L1 of the first partition wall layer L1. During the forming of the cathode CE, a second dummy layer D2-I spaced apart from the cathode CE may be formed together on the partition wall PW. The anode AE, the light-emitting pattern EP, and the cathode CE may constitute the light-emitting element ED.

The capping pattern CP may be arranged on the cathode CE. During the forming of the capping pattern CP, the capping pattern CP may be separated by the tip portion formed on the partition wall PW and arranged in the partition wall opening OP-P. During the forming of the capping pattern CP, a third dummy layer D3-I spaced apart from the capping pattern CP may be formed together on the partition wall PW. According to some embodiments of the present disclosure, the forming of the capping pattern CP may be skipped, and the capping pattern CP may be formed on the auxiliary electrode SE after the auxiliary electrode SE is formed.

The first to third dummy layers D1-I to D3-I may form a dummy layer DMPa-I, and a dummy opening OP-D may be formed in the dummy layer DMPa-I. The dummy opening OP-D may include a first region AA1, a second region AA2, and a third region AA3 sequentially arranged in a thickness direction (i.e., third direction DR3). The first region AA1 of the dummy opening OP-D may be defined by an inner surface of the first dummy layer D1-1, the second region AA2 may be defined by an inner surface of the second dummy layer D2-1, and the third region AA3 may be defined by an inner surface of the third dummy layer D3-1.

Figure 10G:
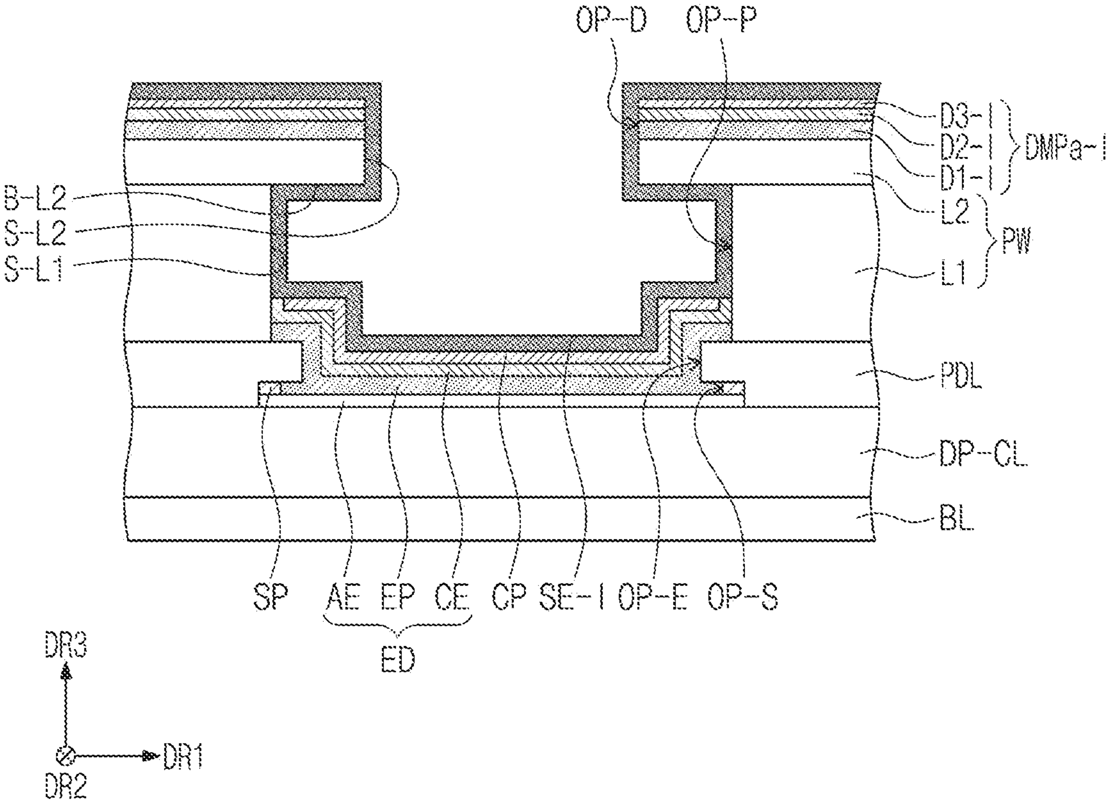

The method for manufacturing a display panel according to some embodiments may include forming the auxiliary electrode SE. Referring to FIG. 10G, the forming of the auxiliary electrode SE may include depositing a preliminary auxiliary electrode SE-I. The preliminary auxiliary electrode SE-I may be formed through a deposition process. According to some embodiments, the forming of the preliminary auxiliary electrode SE-I may include a sputtering process.

The preliminary auxiliary electrode SE-I may be deposited on the cathode CE. For example, the preliminary auxiliary electrode SE-I may be formed on the partition wall PW and the cathode CE, and a portion of the preliminary auxiliary electrode SE-I may be formed inside the partition wall opening OP-P. The preliminary auxiliary electrode SE-I may be formed so as to extend along the first inner surface S-L1 of the first partition wall layer L1, the lower surface B-L2 of the second partition wall layer L2, the second inner surface S-L2 of the second partition wall layer L2, and an upper surface of the second partition wall layer L2. At least a portion of the preliminary auxiliary electrode SE-I may be formed so as to be arranged in the partition wall opening OP-P.

The preliminary auxiliary electrode SE-I may include a conductive material. The preliminary auxiliary electrode SE-I may include a transparent conductive oxide (TCO). For example, the preliminary auxiliary electrode SE-I may include an indium tin oxide (ITO 140) or indium zinc oxide (IZO). However, the preliminary auxiliary electrode SE-I is not limited thereto and may be formed of various materials such as a conductive polymer material provided that the preliminary auxiliary electrode SE-I has conductivity.

Figure 10H:
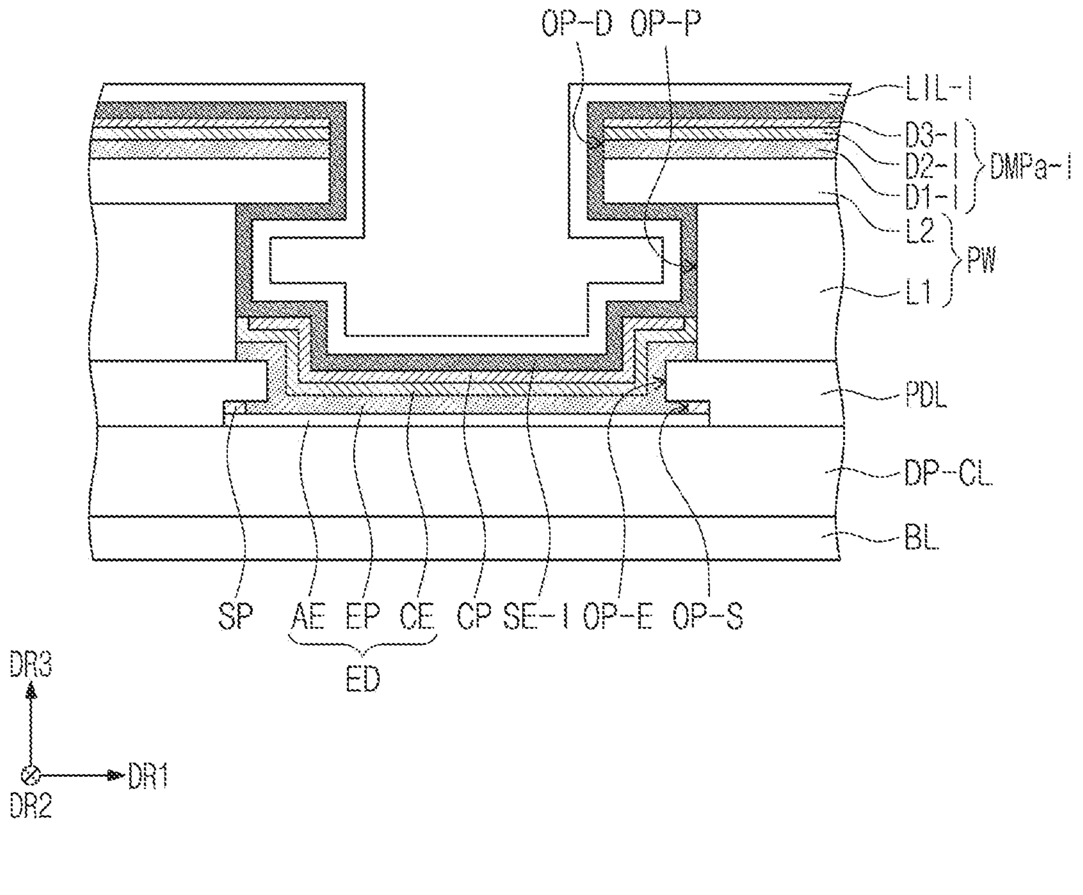

Thereafter, referring to FIG. 10H, the method for manufacturing a display panel according to some embodiments may include forming a lower encapsulation inorganic layer LIL-I. The lower encapsulation inorganic layer LIL-I may be formed through a deposition process. According to some embodiments, the lower encapsulation inorganic layer LIL-I may be formed through a chemical vapor deposition (CVD) process. The lower encapsulation inorganic layer LIL-I may be formed on the partition wall PW and the preliminary auxiliary electrode SE-I, and a portion of the lower encapsulation inorganic layer LIL-I may be formed inside the partition wall opening OP-P. The lower encapsulation inorganic layer LIL-I may be formed in direct contact with the preliminary auxiliary electrode SE-I.

Figure 10I:
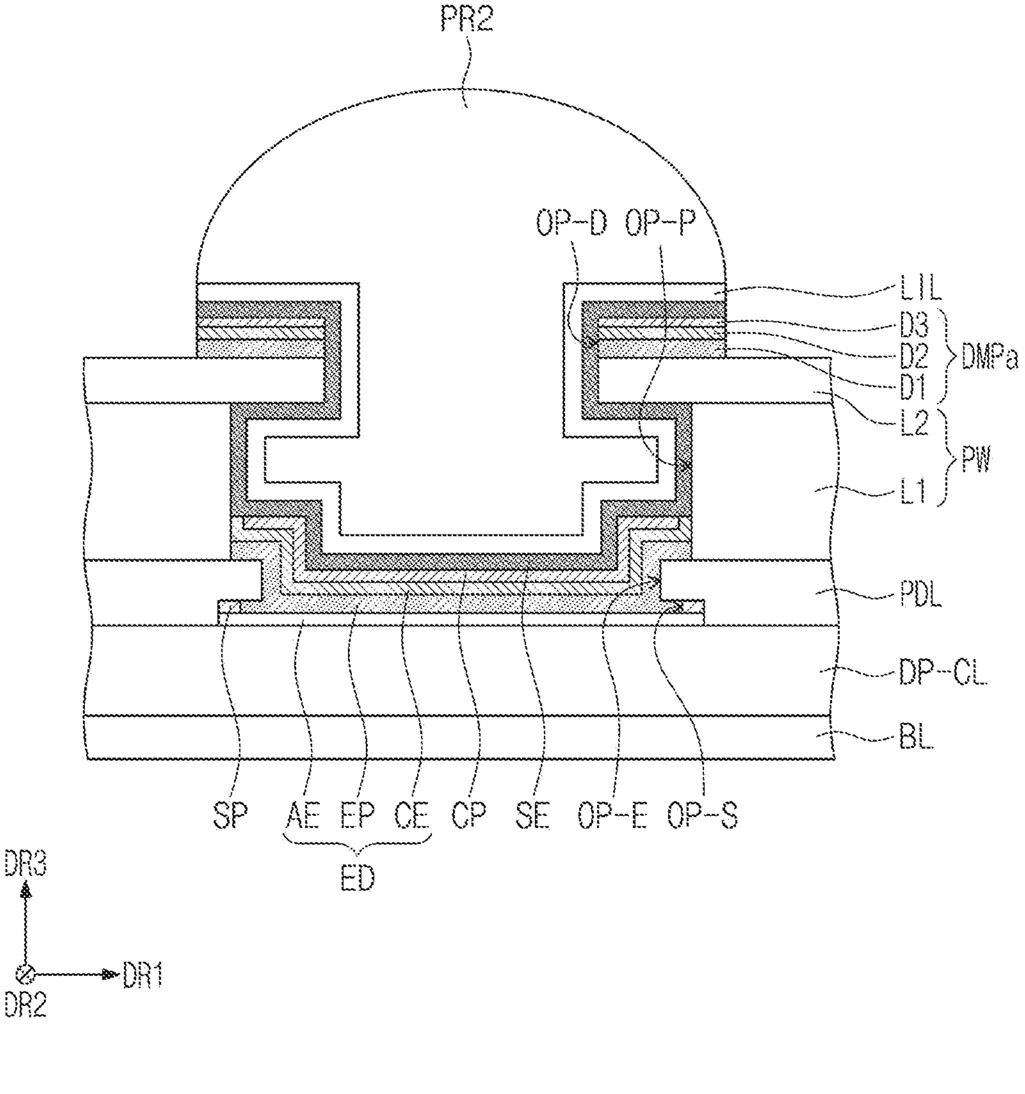

Thereafter, referring to FIG. 10I, the method for manufacturing a display panel according to some embodiments may include forming a second photoresist layer PR2, patterning the lower encapsulation inorganic layer LIL-I (see FIG. 10H) so as to form the lower encapsulation inorganic pattern LIL, patterning the preliminary auxiliary electrode SE-I (see FIG. 10H) so as to form the auxiliary electrode SE, and patterning the dummy layer DMPa-I (see FIG. 10H) so as to form the dummy patterns DMPa.

During the forming of the second photoresist layer PR2, the second photoresist pattern PR2 may be formed by forming a preliminary photoresist layer and patterning the preliminary photoresist layer using a photomask. The second photoresist layer PR2 may be formed in a pattern shape corresponding to the emission opening OP-E through a patterning process.

During the patterning of the lower encapsulation inorganic layer LIL-I, the lower encapsulation inorganic layer LIL-I may be patterned by being dry etched so as to remove a portion of the lower encapsulation inorganic layer LIL-I overlapping anodes except for the corresponding anode AE. The lower encapsulation inorganic pattern LIL overlapping the corresponding emission opening OP-E may be formed from the patterned lower encapsulation inorganic layer LIL-I.

During the patterning of the preliminary auxiliary electrode SE-I, the preliminary auxiliary electrode SE-I may be patterned by being dry etched so as to remove a portion of the preliminary auxiliary electrode SE-I overlapping anodes except for the corresponding anode AE. The auxiliary electrode SE overlapping the corresponding emission opening OP-E may be formed from the patterned preliminary auxiliary electrode SE-I.

The auxiliary electrode SE may be arranged on the cathode CE. The auxiliary electrode SE may extend along the first inner surface S-L1 (see FIG. 10G) of the first partition wall layer L1, the lower surface B-L2 (see FIG. 10G) of the second partition wall layer L2, and the second inner surface S-L2 (see FIG. 10G) of the second partition wall layer L2. A portion of the lower encapsulation inorganic pattern LIL may be arranged in the partition wall opening OP-P, and another portion of the lower encapsulation inorganic pattern LIL may be arranged on the partition wall PW. The lower encapsulation inorganic pattern LIL may be arranged on the auxiliary electrode SE and cover the same. The lower encapsulation inorganic pattern LIL may directly contact the auxiliary electrode SE.

During the patterning of the dummy layer DMPa-I (see FIG. 10H), the first to third dummy layers D1-I to D3-I (see FIG. 10H) may be patterned by being dry etched so as to remove a portion of the first to third dummy layers D1-I to D3-I overlapping anodes except for the corresponding anode AE.

The first to third dummy patterns D1 to D3 overlapping the corresponding emission opening OP-E may be formed from the patterned first to third dummy layers D1-I to D1-3 so that the dummy patterns DMPa including the first to third dummy patterns D1 to D3 may be formed. The first to third dummy patterns D1 to D3 may have a closed-line shape surrounding the corresponding light-emitting region PXA (see FIG. 5) in a plan view.

Figure 10J:
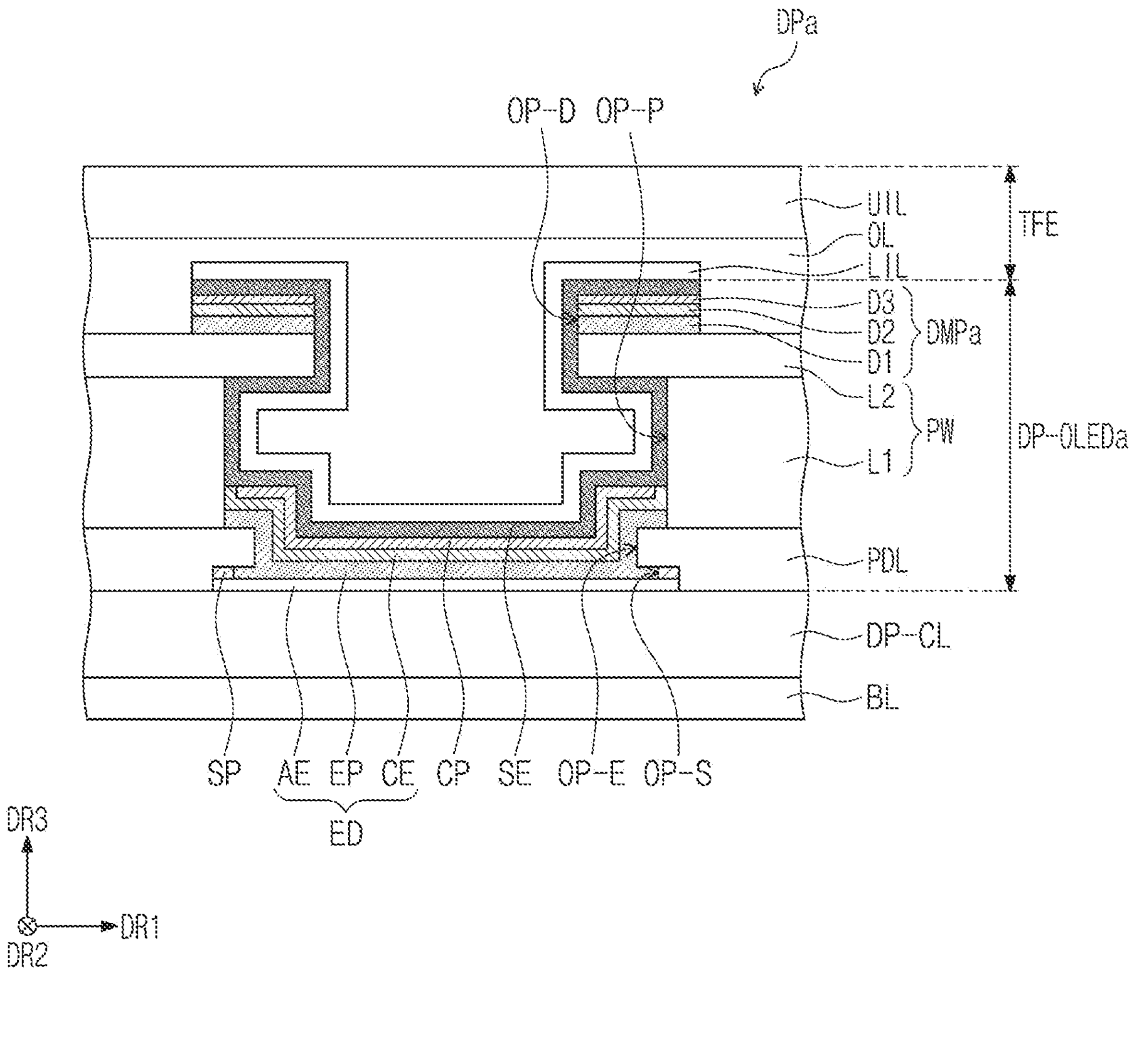

Thereafter, referring to FIG. 10J, the method for manufacturing a display panel according to some embodiments may include completing the display panel DPa by forming the encapsulation organic layer OL and the upper encapsulation inorganic layer UIL after removing the second photoresist layer PR2 (see FIG. 10I). The encapsulation organic layer OL may be formed by applying an organic material using an inkjet printing method, but is not limited thereto. The encapsulation organic layer OL provides a planarized upper surface. Thereafter, the upper encapsulation inorganic layer UIL may be formed by depositing an inorganic material. In this manner, the, the display panel DPa including the base layer BL, the circuit element layer DP-CL, the display element layer DP-OLEDa, and the thin-film encapsulation layer TFE may be formed.

Forming a partition wall opening and emission opening corresponding to a light-emitting region of a different color in the partition wall PW and the pixel defining layer PDL, forming light-emitting elements providing the different color, and forming a lower encapsulation inorganic pattern covering the light-emitting elements that provide the different color may be further performed between the forming of the lower encapsulation inorganic pattern LIL and the completing of the display panel DPa. In this manner, the display panel DPa may be formed, which includes first to third light-emitting elements, first to third capping patterns, 1-1st to 1-3rd dummy patterns, 2-1st to 2-3rd dummy patterns, 3-1st to 3-3rd dummy patterns, and first to third lower encapsulation inorganic patterns, corresponding to the plurality of light-emitting regions PXA-R, PXA-G, and PXA-B illustrated in FIG. 5.

Figure 11:
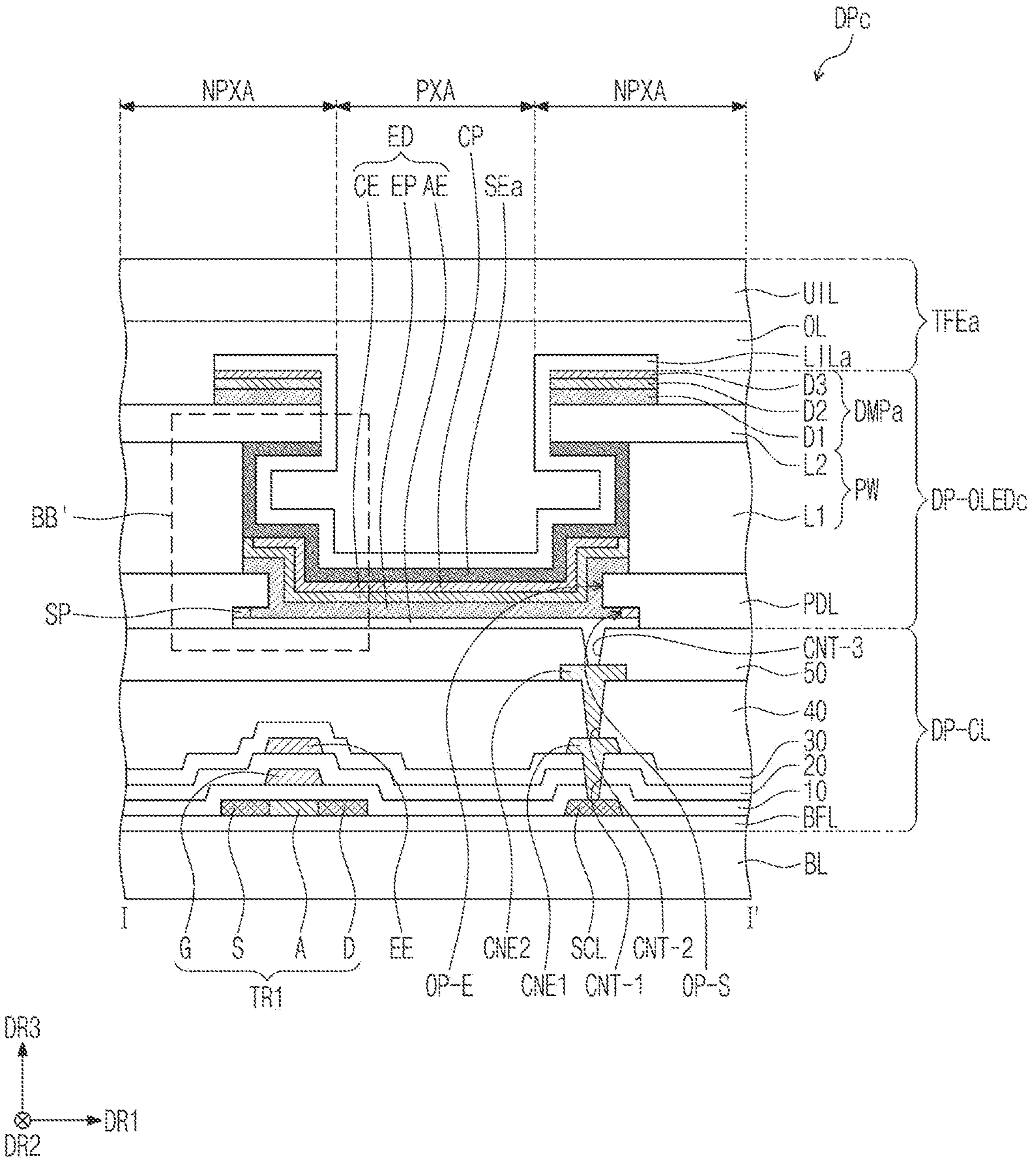
FIG. 11 is a cross-sectional view of the display panel according to some embodiments of the present disclosure taken along the line I-I of FIG. 3.

FIG. 11 is a cross-sectional view of the display panel according to some embodiments of the present disclosure taken along the line I-I of FIG. 3. In describing FIG. 11, the same/similar reference signs are used for the same/similar components described with reference to FIGS. 6 and 8, and overlapping descriptions will not be provided.

Referring to FIG. 11, a display panel DPc may include the base layer BL, the circuit element layer DP-CL, a display element layer DP-OLEDc, and a thin-film encapsulation layer TFEa. The display element layer DP-OLEDc may include the light-emitting element ED, the sacrificial pattern SP, the pixel defining layer PDL, the partition wall PW, an auxiliary electrode SEa, the dummy patterns DMPa, and the capping pattern CP. That is, the display panel DPc of FIG. 11 may further include the capping pattern CP compared to the display panel DP of FIG. 6, and the auxiliary electrode SEa of FIG. 11 may differ in shape from the auxiliary electrode SE of FIG. 6. Descriptions of the capping pattern CP of FIG. 11 may be substantially the same as the descriptions of the capping pattern CP of FIG. 8.

The auxiliary electrode SEa may be arranged on the light-emitting element ED. For example, the auxiliary electrode SEa may be arranged on the cathode CE and the capping pattern CP. The auxiliary electrode SEa may extend along the first inner surface S-L1 of the first partition wall layer L1 and the lower surface B-L2 of the second partition wall layer L2. The auxiliary electrode SEa may be arranged in the partition wall opening OP-P.

The auxiliary electrode SEa may have conductivity. The auxiliary electrode SEa may include a transparent conductive oxide (TCO). For example, the auxiliary electrode SEa may include an indium tin oxide (ITO) or indium zinc oxide (IZO). However, the auxiliary electrode SEa is not limited thereto and may be formed of various materials such as a conductive polymer material provided that the auxiliary electrode SEa has conductivity.

Figure 12:
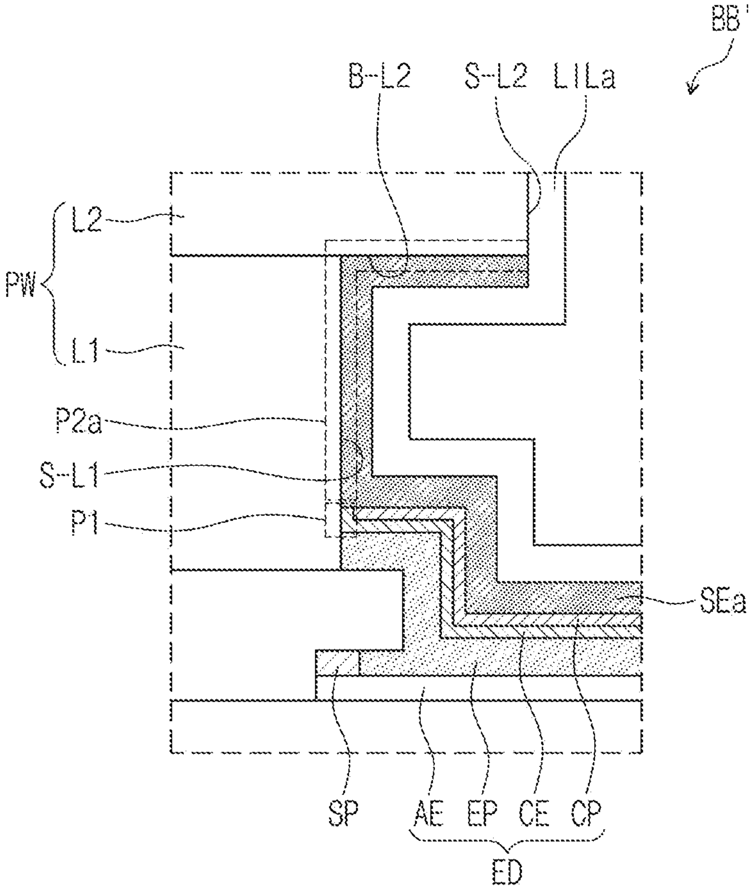
FIG. 12 is an enlarged view of the region BB' of FIG. 11.

FIG. 12 is an enlarged view of the region BB' of FIG. 11.

Referring to FIGS. 11 and 12, the light-emitting pattern EP and the cathode CE may contact the first inner surface S-L1 of the first partition wall layer L1, and the auxiliary electrode SEa may contact the first inner surface S-L1 of the first partition wall layer L1 and the lower surface B-L2 of the second partition wall layer L2. The partition wall PW may include a first portion P1 that the cathode CE contacts and a second portion P2*a* that the auxiliary electrode SEa contacts. An area size of the second portion P2*a* may be larger than an area size of the first portion P1. The auxiliary electrode SEa may cover the cathode CE. For example, the auxiliary electrode SEa may cover the cathode CE and the capping pattern CP.

A lower encapsulation inorganic pattern LILa may be arranged on the auxiliary electrode SEa. The lower encapsulation inorganic pattern LILa may directly contact the auxiliary electrode SEa. For example, the lower encapsulation inorganic pattern LILa may directly contact the auxiliary electrode SEa in the partition wall opening OP-P, and may directly contact the second inner surface S-L2 of the second partition wall layer L2.

Adhesive strength between the auxiliary electrode SEa and the cathode CE and adhesive strength between the auxiliary electrode SEa and the lower encapsulation inorganic pattern LILa may be higher than adhesive strength between the lower encapsulation inorganic pattern LILa and the cathode CE. According to some embodiments of the present disclosure, because the auxiliary electrode SEa is arranged between the lower encapsulation inorganic pattern LILa and the cathode CE, the lower encapsulation inorganic pattern LILa and the cathode CE may not contact each other. Because the lower encapsulation inorganic pattern LILa is stably coupled to the auxiliary electrode SEa, floating of the lower encapsulation inorganic pattern LILa may be reduced or avoided. Therefore, instances of foreign matter or contaminants permeating the display element layer DP-OLEDc may be prevented or reduced.

Figure 13A:
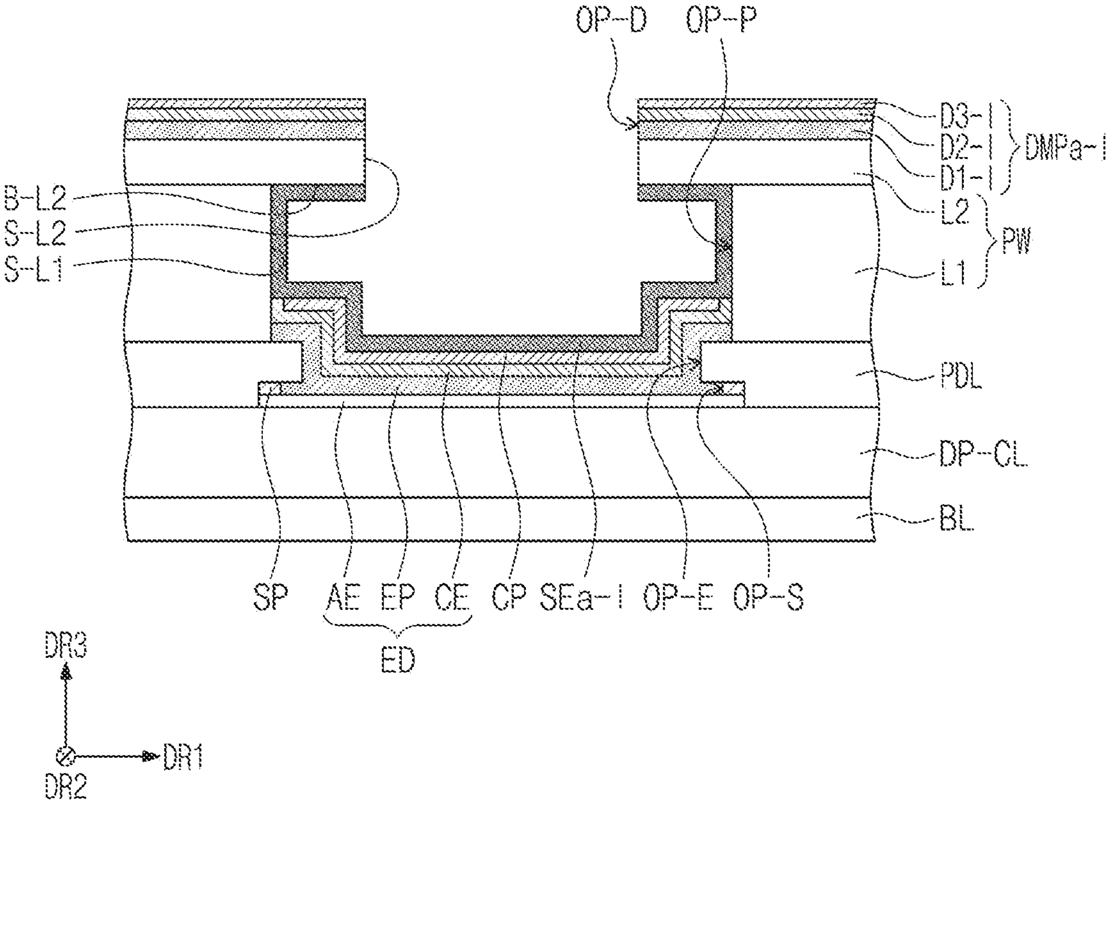
FIGS. 13A and 13B are cross-sectional views partially illustrating a method for manufacturing a display panel according to some embodiments of the present disclosure.
Figure 13B:
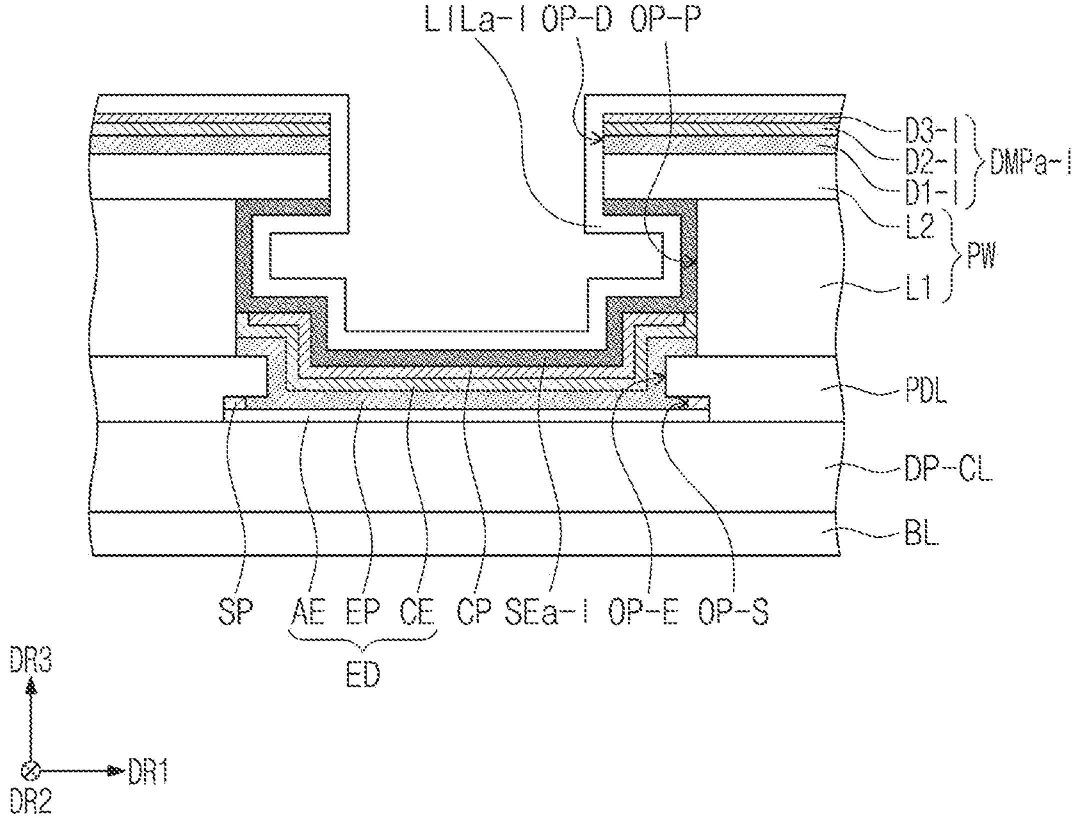

FIGS. 13A and 13B are cross-sectional views partially illustrating a method for manufacturing a display panel according to some embodiments of the present disclosure. FIG. 13A illustrates a process corresponding to that of FIG. 10G, and FIG. 13B illustrates a process corresponding to that of FIG. 10H. In describing FIGS. 13A and 13B, the same/similar reference signs are used for the same/similar components described with reference to FIGS. 10A to 10J, and overlapping descriptions will not be provided.

Referring to FIG. 13A, the method for manufacturing a display panel according to some embodiments may include forming the auxiliary electrode SEa. Processes prior to the forming of the auxiliary electrode SEa may be substantially the same as the processes described with reference to FIGS. 10A to 10F. The forming of the auxiliary electrode SEa may include depositing a preliminary auxiliary electrode SEa-I. The preliminary auxiliary electrode SEa-I may be formed through a deposition process. According to some embodiments, the forming of the preliminary auxiliary electrode SEa-I may include a sputtering process.

The preliminary auxiliary electrode SEa-I may be deposited on the cathode CE. For example, the preliminary auxiliary electrode SEa-I may be formed on the cathode CE and inside the partition wall opening OP-P. The preliminary auxiliary electrode SEa-I may be formed so as to extend along the first inner surface S-L1 of the first partition wall layer L1 and the lower surface B-L2 of the second partition wall layer L2.

The preliminary auxiliary electrode SEa-I may include a conductive material. The preliminary auxiliary electrode SEa-I may include a transparent conductive oxide (TCO). For example, the preliminary auxiliary electrode SEa-I may include an indium tin oxide (ITO 140) or indium zinc oxide (IZO). However, the preliminary auxiliary electrode SEa-I is not limited thereto and may be formed of various materials such as a conductive polymer material provided that the preliminary auxiliary electrode SEa-I has conductivity.

Thereafter, referring to FIG. 13B, the method for manufacturing a display panel according to some embodiments may include forming a lower encapsulation inorganic layer LILa-I. The lower encapsulation inorganic layer LILa-I may be formed through a deposition process. According to some embodiments, the lower encapsulation inorganic layer LILa-I may be formed through a chemical vapor deposition (CVD) process. The lower encapsulation inorganic layer LILa-I may be formed on the partition wall PW and the preliminary auxiliary electrode SEa-I, and a portion of the lower encapsulation inorganic layer LILa-I may be formed inside the partition wall opening OP-P. The lower encapsulation inorganic layer LILa-I may be formed in direct contact with the preliminary auxiliary electrode SEa-I. For example, the lower encapsulation inorganic layer LILa-I may directly contact the preliminary auxiliary electrode SEa-I in the partition wall opening OP-P, and may directly contact the second inner surface S-L2 (see FIG. 11) of the second partition wall layer L2. Thereafter, the subsequent manufacturing process may be substantially the same as the process described with reference to FIG. 10I.

According to the above descriptions, adhesive strength between an auxiliary electrode and a cathode and adhesive strength between the auxiliary electrode and a lower encapsulation inorganic pattern may be relatively higher than adhesive strength between the lower encapsulation inorganic pattern and the cathode. Because the auxiliary electrode is arranged between the lower encapsulation inorganic pattern and the cathode, the lower encapsulation inorganic pattern and the cathode may not contact each other. Because the lower encapsulation inorganic pattern is stably coupled to the auxiliary electrode, floating of the lower encapsulation inorganic pattern may be reduced or avoided. Therefore, instances of foreign matter or contaminants permeating a display element layer may be prevented or reduced.

Although aspects of some embodiments of the present invention have been described, it is understood that the present invention should not be limited to these embodiments but various changes and modifications can be made by one ordinary skilled in the art within the spirit and scope of the present invention according to the appended claims, and their equivalents.

What is claimed is:

1. A display panel comprising:
- a base layer;
- a pixel defining layer on the base layer and having an emission opening;
- a partition wall comprising:
  - a first partition wall layer on the pixel defining layer; and
  - a second partition wall layer on the first partition wall layer and having a partition wall opening corresponding to the emission opening;
- a light-emitting element in the partition wall opening and including an anode, an intermediate layer, and a cathode contacting the partition wall; and
- an auxiliary electrode on the light-emitting element and extending along a first inner surface of the first partition wall layer and a lower surface of the second partition wall layer.

2. The display panel of claim 1, wherein the auxiliary electrode extends along the first inner surface of the first partition wall layer, the lower surface of the second partition wall layer, and a second inner surface of the second partition wall layer.

3. The display panel of claim 1,
- wherein the partition wall includes a first portion that the cathode contacts and a second portion that the auxiliary electrode contacts,
- wherein an area size of the second portion is larger than an area size of the first portion.

4. The display panel of claim 1, wherein the auxiliary electrode covers the cathode.

5. The display panel of claim 1, further comprising a lower encapsulation inorganic pattern on the auxiliary electrode,
- wherein the lower encapsulation inorganic pattern directly contacts the auxiliary electrode.

6. The display panel of claim 1, further comprising a capping pattern on the cathode.

7. The display panel of claim 6, wherein the cathode, the capping pattern, and the auxiliary electrode are sequentially arranged in a thickness direction of the base layer.

8. The display panel of claim 6, wherein the cathode, the auxiliary electrode, and the capping pattern are sequentially arranged in a thickness direction of the base layer.

9. The display panel of claim 1, wherein the auxiliary electrode includes an indium tin oxide (ITO) or indium zinc oxide (IZO).

10. A display panel comprising:
- a base layer;
- a pixel defining layer on the base layer and having an emission opening;
- a partition wall comprising:
  - a first partition wall layer on the pixel defining layer; and
  - a second partition wall layer on the first partition wall layer and having a partition wall opening corresponding to the emission opening;
- a light-emitting element in the partition wall opening and including an anode, an intermediate layer, and a cathode contacting the partition wall;
- an auxiliary electrode on the light-emitting element; and
- a lower encapsulation inorganic pattern on the auxiliary electrode,
- wherein the lower encapsulation inorganic pattern directly contacts the auxiliary electrode.

11. The display panel of claim 10, wherein the auxiliary electrode extends along a first inner surface of the first partition wall layer and a lower surface of the second partition wall layer.

12. The display panel of claim 10, wherein the auxiliary electrode covers the cathode.

13. The display panel of claim 10, further comprising
- a capping pattern on the cathode,
- wherein the cathode, the capping pattern, and the auxiliary electrode are sequentially arranged in a thickness direction of the base layer.

14. The display panel of claim 10, further comprising a capping pattern on the cathode, wherein the cathode, the auxiliary electrode, and the capping pattern are sequentially arranged in a thickness direction of the base layer.

15. The display panel of claim 10, wherein the auxiliary electrode includes an indium tin oxide (ITO) or indium zinc oxide (IZO).

16. The display panel of claim 10, wherein the partition wall includes a first portion that the cathode contacts and a second portion that the auxiliary electrode contacts,
- wherein an area size of the second portion is larger than an area size of the first portion.

17. A method for manufacturing a display panel, the method comprising:
- providing a preliminary display panel including a base layer, a pixel defining layer on the base layer, a first preliminary partition wall layer on the pixel defining layer, and a second preliminary partition wall layer on the first preliminary partition wall layer;
- forming a first partition wall layer and a second partition wall layer in which a partition wall opening is defined by etching the first preliminary partition wall layer and the second preliminary partition wall layer;
- forming a light-emitting pattern and a cathode contacting the first partition wall layer in the partition wall opening; and
- forming, on the cathode, an auxiliary electrode extending along a first inner surface of the first partition wall layer and a lower surface of the second partition wall layer.

18. The method of claim 17, wherein the forming of the light-emitting pattern and the cathode includes a thermal evaporation process, and the forming of the auxiliary electrode includes a sputtering process.

19. The method of claim 17, further comprising forming a lower encapsulation inorganic pattern on the auxiliary electrode,
- wherein the lower encapsulation inorganic pattern directly contacts the auxiliary electrode.

20. The method of claim 19, further comprising forming a capping pattern on the cathode.

* * * * *